(12) United States Patent
Alon et al.

(10) Patent No.: US 8,611,030 B2
(45) Date of Patent: *Dec. 17, 2013

(54) OPTICS FOR AN EXTENDED DEPTH OF FIELD

(71) Applicants: Alex Alon, Binyamina (IL); Irina Alon, Binyamina (IL); Haim Bezdin, Rishon Lezion (IL)

(72) Inventors: Alex Alon, Binyamina (IL); Irina Alon, Binyamina (IL); Haim Bezdin, Rishon Lezion (IL)

(73) Assignee: DigitalOptics Corporation International, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/625,390

(22) Filed: Sep. 24, 2012

(65) Prior Publication Data

US 2013/0116981 A1    May 9, 2013

Related U.S. Application Data

(63) Continuation of application No. 13/196,051, filed on Aug. 2, 2011, now Pat. No. 8,294,999, which is a continuation of application No. 12/093,394, filed as application No. PCT/IL2006/001294 on Nov. 9, 2006, now Pat. No. 7,773,316, and a continuation-in-part of application No. 10/541,967, filed on Jun. 23, 2006, now Pat. No. 7,627,193, which is a continuation-in-part of application No. 11/278,255, filed on Mar. 31, 2006, now abandoned, and a continuation-in-part of application No. 10/541,967, filed as application No. PCT/IL2004/000040 on Jan. 15, 2004, now Pat. No. 7,627,193.

(60) Provisional application No. 60/735,441, filed on Nov. 10, 2005, provisional application No. 60/440,561, filed on Jan. 16, 2003.

(51) Int. Cl.
*G02B 27/00* (2006.01)

(52) U.S. Cl.
USPC .......................................................... 359/896

(58) Field of Classification Search
USPC ................. 359/362–435, 676–706, 708–719, 359/745–795, 896; 703/6, 13
See application file for complete search history.

(56) References Cited

U.S. PATENT DOCUMENTS

| 4,532,548 A | 7/1985 | Zwirn |
| 4,691,366 A | 9/1987 | Fenster et al. |

(Continued)

FOREIGN PATENT DOCUMENTS

| EP | 0466277 A1 | 1/1992 |
| EP | 0814605 | 12/1997 |

(Continued)

OTHER PUBLICATIONS

Patent Abstract of Japanese Patent No. JP 2000 244799.

(Continued)

*Primary Examiner* — Darryl J Collins
(74) *Attorney, Agent, or Firm* — Turocy & Watson, LLP

(57) ABSTRACT

An optical imaging assembly having cylindrical symmetry, comprising a plurality of lenses having surfaces with curvatures and spacings between the surfaces, such that an optical image formed by the plurality of lenses has a defocus aberration coefficient greater than 0.1 at a focal plane of the assembly.

18 Claims, 15 Drawing Sheets

(56) References Cited

U.S. PATENT DOCUMENTS

| | | | |
|---|---|---|---|
| 5,023,641 | A | 6/1991 | Merrick |
| 5,307,175 | A | 4/1994 | Seachman |
| 5,535,291 | A | 7/1996 | Spencer et al. |
| 5,580,728 | A | 12/1996 | Perlin |
| 5,748,371 | A | 5/1998 | Cathey, Jr. et al. |
| 5,748,491 | A | 5/1998 | Allison et al. |
| 5,751,861 | A | 5/1998 | Astle |
| 5,867,410 | A | 2/1999 | Smallcombe et al. |
| 6,069,738 | A | 5/2000 | Cathey, Jr. et al. |
| 6,094,467 | A | 7/2000 | Gayer et al. |
| 6,147,815 | A | 11/2000 | Fujie |
| 6,154,574 | A | 11/2000 | Paik et al. |
| 6,240,219 | B1 | 5/2001 | Gregory |
| 6,333,990 | B1 | 12/2001 | Yazici et al. |
| 6,344,893 | B1 | 2/2002 | Mendlovic et al. |
| 6,525,302 | B2 | 2/2003 | Dowski, Jr. et al. |
| 6,545,714 | B1 | 4/2003 | Takada et al. |
| 6,567,570 | B1 | 5/2003 | Steinle et al. |
| 6,704,440 | B1 | 3/2004 | Kump |
| 6,757,012 | B1 | 6/2004 | Hubina et al. |
| 6,900,838 | B1 | 5/2005 | Fujimura et al. |
| 6,927,922 | B2 | 8/2005 | George et al. |
| 7,003,177 | B1 | 2/2006 | Mendlovic et al. |
| 7,012,749 | B1 | 3/2006 | Mendlovic et al. |
| 7,061,693 | B2 | 6/2006 | Zalevsky et al. |
| 7,065,256 | B2 | 6/2006 | Alon et al. |
| 7,627,193 | B2 * | 12/2009 | Alon et al. .......... 382/275 |
| 7,773,316 | B2 | 8/2010 | Alon et al. |
| 8,294,999 | B2 * | 10/2012 | Alon et al. .......... 359/896 |
| 2002/0012055 | A1 | 1/2002 | Koshiba et al. |
| 2002/0052722 | A1 | 5/2002 | Yabe |
| 2002/0118457 | A1 | 8/2002 | Dowski |
| 2002/0145671 | A1 | 10/2002 | Alon et al. |
| 2003/0057353 | A1 | 3/2003 | Dowski et al. |
| 2003/0063384 | A1 | 4/2003 | Dowski |
| 2003/0169944 | A1 | 9/2003 | Dowski et al. |
| 2004/0096125 | A1 | 5/2004 | Alderson et al. |
| 2004/0218803 | A1 | 11/2004 | Chanas et al. |
| 2004/0234152 | A1 | 11/2004 | Liege et al. |
| 2004/0240750 | A1 | 12/2004 | Chauville et al. |
| 2004/0247195 | A1 | 12/2004 | Chauville et al. |
| 2004/0247196 | A1 | 12/2004 | Chanas et al. |
| 2004/0252906 | A1 | 12/2004 | Liege et al. |
| 2005/0002586 | A1 | 1/2005 | Liege et al. |
| 2005/0008242 | A1 | 1/2005 | Liege et al. |
| 2005/0094290 | A1 | 5/2005 | Ben-Eliezer et al. |
| 2005/0117114 | A1 | 6/2005 | Jiang |
| 2005/0197809 | A1 | 9/2005 | Dowski |
| 2006/0050409 | A1 | 3/2006 | George et al. |
| 2006/0056068 | A1 | 3/2006 | Lee et al. |
| 2006/0204861 | A1 | 9/2006 | Ben-Eliezer et al. |

FOREIGN PATENT DOCUMENTS

| | | |
|---|---|---|
| EP | 1079612 A2 | 2/2001 |
| EP | 1627526 | 2/2006 |
| WO | 2004063989 | 7/2004 |
| WO | 2005031646 | 4/2005 |
| WO | 2006039486 | 4/2006 |

OTHER PUBLICATIONS

Kenneth Kubala, et al., "Reducing complexity in computational imaging systems", Sep. 8, 2003, Optics Express, vol. 11, No. 18, pp. 2102-2108.

Born & Wolf, In principles of Optics, 4th Edition (Pergamon Press, 1970), in Section 9.2, pp. 464-467.

S.N. Bezdid'ko, "The use of zernike polynomials in optics", Sov. J. Opt. Technol., vol. 41, No. 9, Sep. 1974, pp. 425-429.

U.S. Appl. No. 60/735,519.

Dowski E R, et al., "Wavefront coding: A modern method of achieving high performance and/or low cost imaging systems", Proceedings of the SPIE, Bellingham, VA, US, vol. 3779, Jul. 1999, pp. 137-145.

Altar-Gartenbeg R: "Information metric as a design tool for optoelectronic imaging systems", Applied Optics, OSA, Optical Society of America, Washington DC, US, vol. 39, No. 11, Apr. 2000, pp. 1743-1760.

Michael Bass: "Handbook of optics III", 1995, Mcgraw-Hill, Inc. New York, p. 36.9.

European Search Report for EP Application 06 11 1394.

U.S. Appl. No. 60/440,561, "Lensless Camera with Image Enhancement Functions".

Rebiai et al., "Image Distortion from Zoom Lenses: Modeling and Digital COrrection" IBC—International Broadcasting Convention IEEE Jul. 1992.

Dowski et al. "Wavefront Coding: Jointly Optimized Optical and Digital Imaging Systems," Visual Information Processing IX, Proceedings of SPIE, 2000.

OA dated Feb. 27, 2012 for U.S. Appl. No. 13/196,051, 17 pages.

* cited by examiner

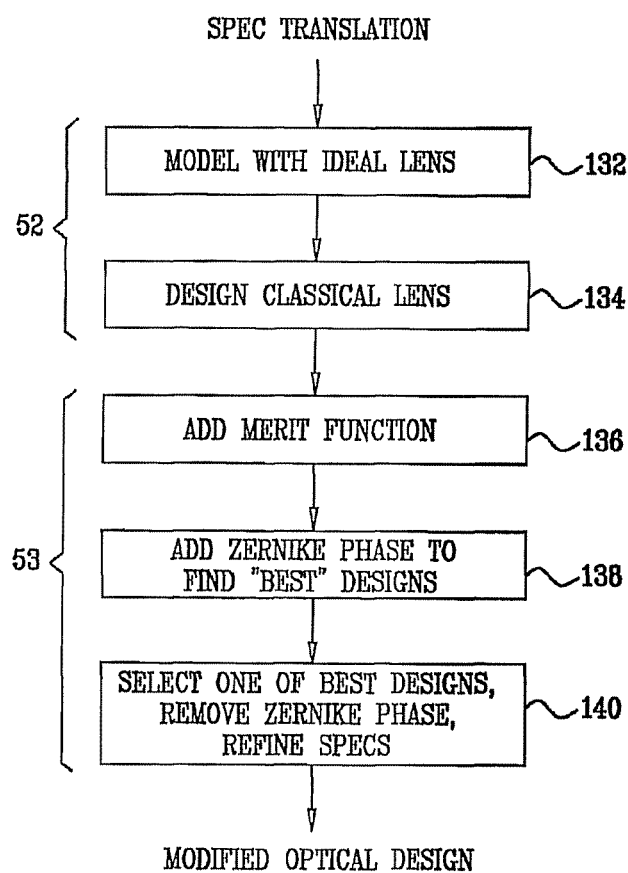

OPTICAL PATH DIFFERENCE AT DIFFERENT FIELDS OF VIEW (FOV)

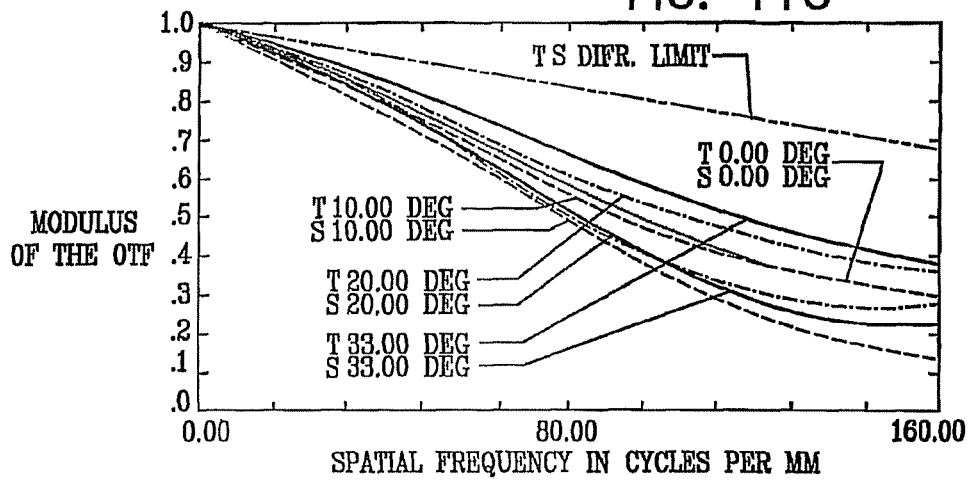
FIG. 11C
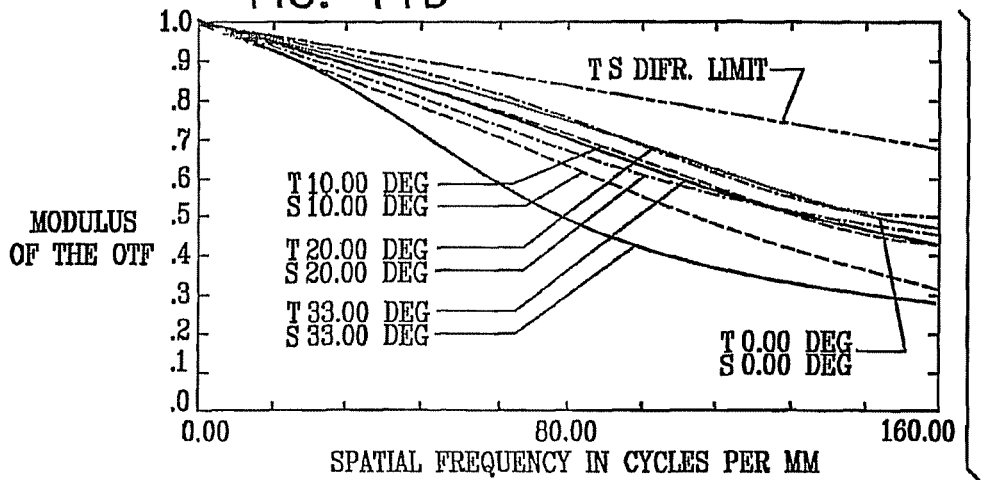
FIG. 11D
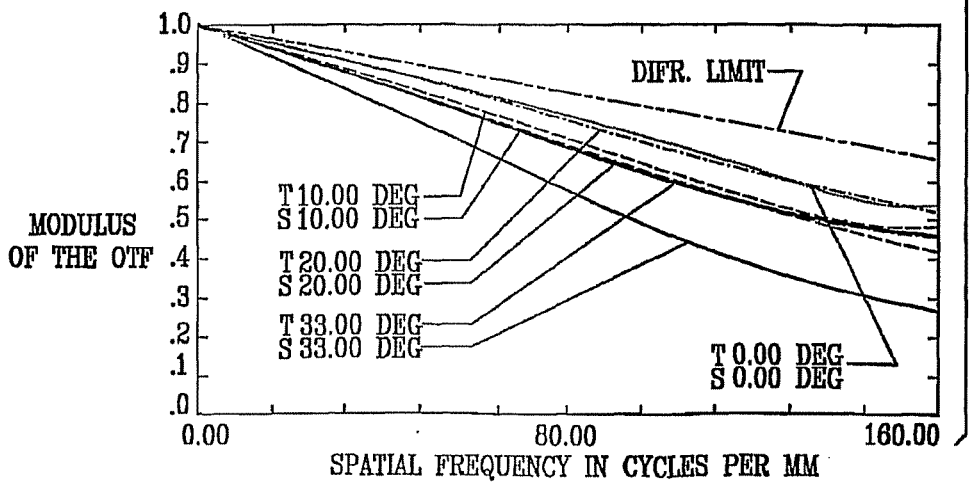

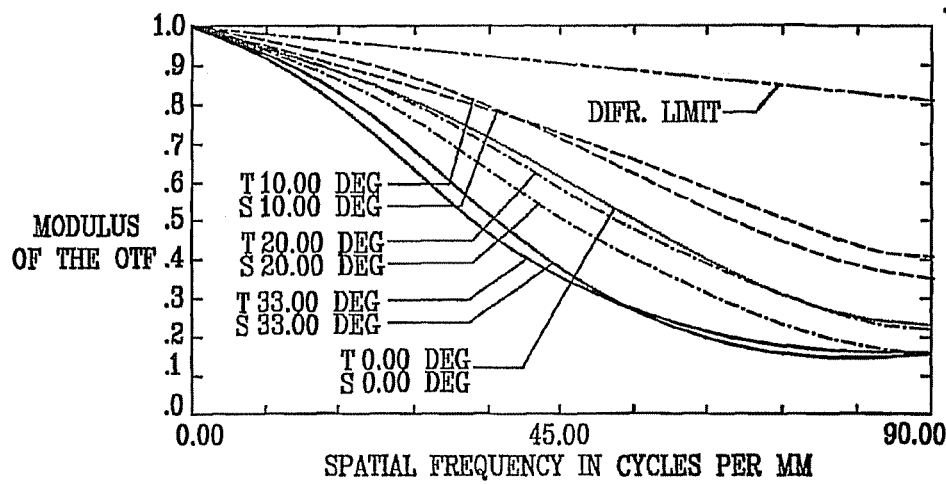
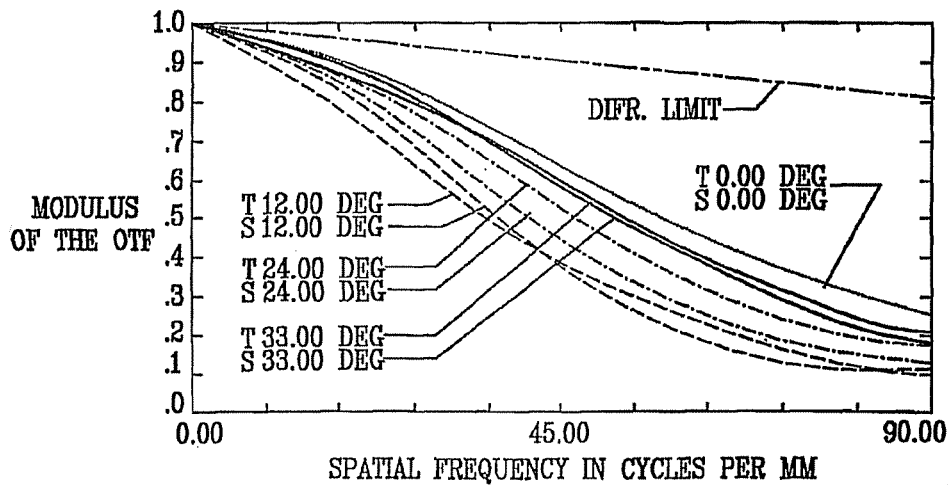
FIG. 11E

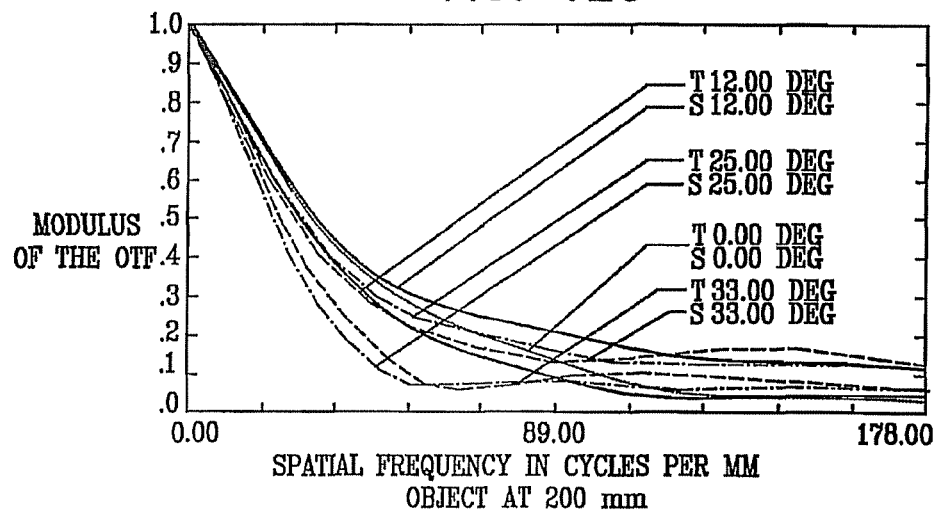
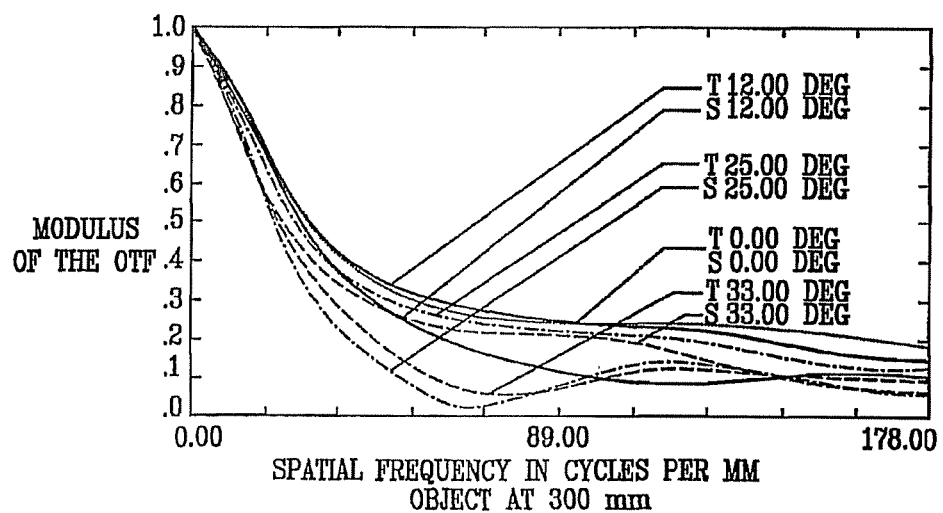

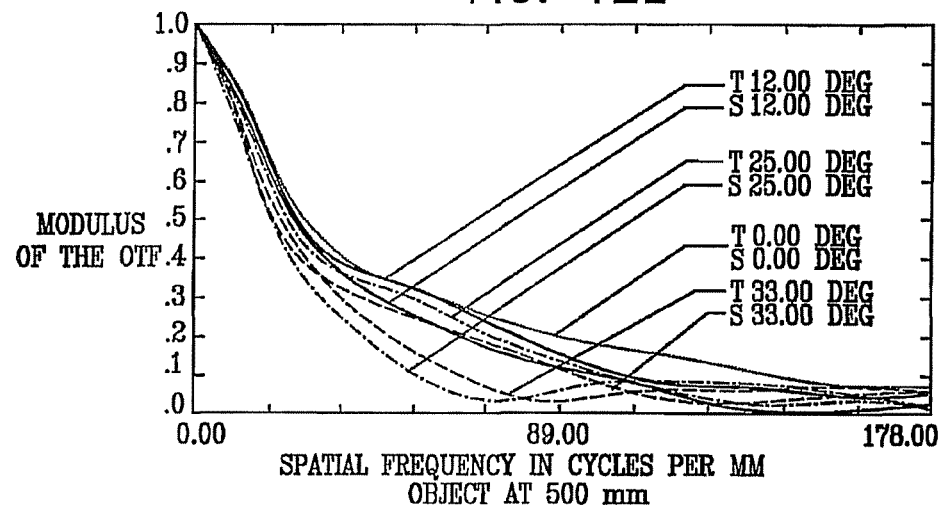
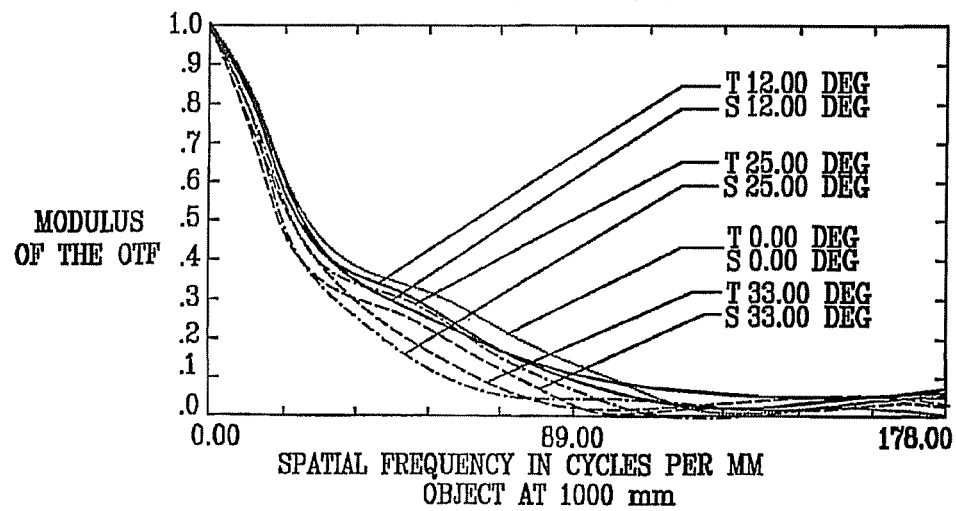

OPTICS FOR AN EXTENDED DEPTH OF FIELD

CROSS-REFERENCE TO RELATED APPLICATIONS

This application is a continuation of U.S. patent application Ser. No. 13/196,051, now U.S. Pat. No. 8,294,999 B2, filed Aug. 2, 2011, which was a continuation of U.S. patent application Ser. No. 12/093,394, filed Nov. 11, 2008, in the National Stage of PCT Patent Application PCT/IL2006/001294, which was filed Nov. 9, 2006, claiming the benefit of U.S. Provisional Patent Application 60/735,441, filed Nov. 10, 2005. The PCT Patent Application PCT/IL2006/001294 is a continuation-in-part of U.S. patent application Ser. No. 10/541,967, now U.S. Pat. No. 7,627,193, filed Jun. 23, 2006, in the National Stage of PCT Patent Application PCT/IL04/00040, which was filed Jan. 15, 2004, claiming the benefit of U.S. Provisional Patent Application 60/440,561, filed Jan. 16, 2003. The PCT Patent Application PCT/IL2006/001294 is also a continuation-in-part of U.S. patent application Ser. No. 11/278,255, now abandoned, filed Mar. 31, 2006. The entireties of all of the above-referenced related applications are incorporated herein by reference.

FIELD OF THE INVENTION

The present invention relates generally to digital imaging, and specifically to optics and methods for designing digital cameras with an enhanced depth of field.

BACKGROUND OF THE INVENTION

The objective optics used in digital cameras are typically designed so as to minimize the optical point spread function (PSF) and maximize the modulation transfer function (MTF), subject to the limitations of size, cost, aperture size, and other factors imposed by the camera manufacturer. The PSF of the resulting optical system may still vary from the ideal due to focal variations and aberrations. A number of methods are known in the art for measuring and compensating for such PSF deviations by digital image processing. For example, U.S. Pat. No. 6,154,574, whose disclosure is incorporated herein by reference, describes a method for digitally focusing an out-of-focus image in an image processing system. A mean step response is obtained by dividing a defocused image into sub-images, and calculating step responses with respect to the edge direction in each sub-image. The mean step response is used in calculating PSF coefficients, which are applied in turn to determine an image restoration transfer function. An in-focus image is obtained by multiplying this function by the out-of-focus image in the frequency domain.

As another example, U.S. Pat. No. 6,567,570, whose disclosure is incorporated herein by reference, describes an image scanner, which uses targets within the scanner to make internal measurements of the PSF. These measurements are used in computing convolution kernels, which are applied to images captured by the scanner in order to partially compensate for imperfections of the scanner lens system.

It is also possible to add a special-purpose blur to an image so as to create invariance to certain optical aberrations. Signal processing is then used to remove the blur. A technique of this sort is described by Kubala et al., in "Reducing Complexity in Computational Imaging Systems," *Optics Express* 11 (2003), pages 2102-2108, which is incorporated herein by reference. The authors refer to this technique as "Wavefront Coding." A special aspheric optical element is used to create the blur in the image. This optical element may be a separate stand-alone element, or it may be integrated into one or more of the lenses in the optical system. Optical designs and methods of image processing based on Wavefront Coding of this sort are described, for example, in U.S. Pat. No. 5,748,371 and in U.S. Patent Application Publications US 2002/0118457 A1, US 2003/0057353 A1 and US 2003/0169944 A1, whose disclosures are incorporated herein by reference.

SUMMARY OF THE INVENTION

In embodiments of the present invention, an optical imaging assembly that may be used in a digital camera is constructed so as to generate a distorted image at an imaging plane of the assembly. The digital camera incorporates a sensor at the imaging plane, and the distorted image formed on the sensor is corrected by a deconvolution engine so as to produce an undistorted image. The optical imaging assembly is configured to produce a high defocus aberration coefficient, greater than approximately 0.1, across the distorted image when the image is optimally focused to a focal plane of the assembly.

The high defocus aberration coefficient causes a modulation transfer function (MTF) for the assembly to have generally equal low values for all objects in a large field, typically from infinity to approximately 10 cm from the assembly. Because of the equal values of the MTF at the different object distances within the field, the deconvolution engine may be configured to improve the MTF of all the images at the different object distances. The final images thus produced by the assembly and the deconvolution engine are substantially free of aberrations for all objects within the field, so that the digital camera has a depth of field which is significantly higher than depths of field of prior art cameras.

In some embodiments the imaging assembly is designed by assuming that a virtual phase plate is added to the assembly, the virtual phase plate having characteristics that generate aberration coefficients which are the negatives of those required by the deconvolution engine. The assembly with the phase plate is configured to give an undistorted image.

There is therefore provided, according to an embodiment of the present invention, an optical imaging assembly having cylindrical symmetry, including a plurality of lenses having surfaces with curvatures and spacings between the surfaces, such that an optical image formed by the plurality of lenses has a defocus aberration coefficient greater than 0.1 at a focal plane of the assembly. The defocus aberration coefficient may be greater than or equal to 0.6, and less than or equal to 0.9. A fifth order spherical aberration is typically between −0.2 and −0.3, a seventh order spherical aberration may be −0.5, and a ninth order spherical aberration may be 0.

In some embodiments, the curvatures are non-logarithmic.

Typically, the optical image is of one or more objects within a field of view subtending up to 33° to an optic axis of the assembly.

In an embodiment the optical image is of one or more objects which are located at distances greater than or equal to 10 cm from the assembly. Typically, the assembly is configured so that a modulation transfer function generated by the one or more objects at the focal plane is less than or equal to 0.35 for spatial frequencies greater than 50 cycles per mm.

In a disclosed embodiment the optical image has an extent of a point spread function equal to or greater than 14 μm at the focal plane.

There is further provided, according to an embodiment of the present invention, a method for optical imaging, including:

formulating an optical specification of an optical imaging assembly including optical elements having surfaces, the optical specification including one or more aberration coefficients;

generating a virtual phase element having phase coefficients which are negatives of the aberration coefficients;

generating a design of the optical assembly including the optical elements and the virtual phase element so as to determine curvatures and spacings of the surfaces that will focus an image of an object on a focal plane of the assembly in the presence of the virtual phase element; and fabricating the optical assembly in accordance with the curvatures and spacings determined by the design.

In a disclosed embodiment, the method includes generating a digital filter to compensate for the one or more aberration coefficients, and coupling the digital filter to the optical assembly so that a filtered image formed by the digital filter from the image on the focal plane is free of aberrations. Typically, the filtered image is free of aberrations for the object being located at a distance greater than 10 cm from the optical assembly.

There is further provided, according to an embodiment of the present invention, an optical imaging assembly having cylindrical symmetry, including a plurality of lenses having surfaces with curvatures and spacings between the surfaces, such that an optical image formed by the plurality of lenses at a focal plane of the assembly has a modulation transfer function (MTF) for spatial frequencies greater than 50 cycles per millimeter that is less than or equal to 0.35.

There is further provided, according to an embodiment of the present invention, a method for forming an optical imaging assembly, including:

providing a plurality of lenses having cylindrical symmetry and surfaces with curvatures and spacings between the surfaces; and arranging the lenses so that an optical image formed by the plurality of lenses has a defocus aberration coefficient greater than 0.1 at a focal plane of the assembly.

There is further provided, according to an embodiment of the present invention, apparatus for optical imaging, including:

an optical imaging assembly including optical elements having surfaces; and a processor which is configured to:

formulate an optical specification of the optical imaging assembly, the optical specification including one or more aberration coefficients, generate a virtual phase element having phase coefficients which are negatives of the aberration coefficients;

generate a design of the optical assembly including the optical elements and the virtual phase element so as to determine curvatures and spacings of the surfaces that will focus an image of an object on a focal plane of the assembly in the presence of the virtual phase element; and fabricate the optical assembly in accordance with the curvatures and spacings determined by the design.

There is further provided, according to an embodiment of the present invention, a method for forming an optical imaging assembly, including:

providing a plurality of lenses having cylindrical symmetry and surfaces with curvatures and spacings between the surfaces; and arranging the lenses so that an optical image formed by the plurality of lenses at a focal plane of the assembly has a modulation transfer function (MTF) for spatial frequencies greater than 50 cycles per millimeter that is less than or equal to 0.35.

There is further provided, according to an embodiment of the present invention, an optical imaging assembly, including:

an aperture having a semi-diameter of $7.5 \cdot 10^{-1}$ mm; and a plurality of lenses having surfaces with curvatures and spacings between the surfaces, wherein respective surfaces of the plurality of lenses are defined by an equation $$z = \frac{cr^2}{1 + \sqrt{1-(1+k)c^2 r^2}} + \sum_{n=2}^{n=8} \alpha_n r^{2n}$$

where z is a sag of the surface, r is a radius measured to an optic axis of the assembly, c, k are respective curvature and conic constants for the surface, and $\alpha_2, \ldots \alpha_8$ are parameters for the surface, the lenses including:

a first aspheric lens following the aperture, having a refractive index 1.53, a first surface wherein $c=9.57 \cdot 10^{-2}$, $k=9.74 \cdot 10^1$, $\alpha_2=-1.38 \cdot 10^{-2}$, $\alpha_3=-9.0 \cdot 10^{-1}$, $\alpha_4=2.83$, $\alpha_5=-2.26$, $\alpha_6=-2.96$, $\alpha_7=2.69$, $\alpha_8=1.61$, and a second surface wherein $c=-4.46 \cdot 10^{-1}$, $k=0$, $\alpha_2=-9.83 \cdot 10^{-2}$, $\alpha_3=1.24 \cdot 10^{-1}$, $\alpha_4=-4.25 \cdot 10^{-1}$, $\alpha_5=7.62 \cdot 10^{-1}$, $\alpha_6=-8.04 \cdot 10^{-1}$, $\alpha_7=4.73 \cdot 10^{-1}$, $\alpha_8=-1.28 \cdot 10^{-1}$;

a second aspheric lens following the first aspheric lens, having a refractive index 1.61, a third surface wherein $c=-7.60 \cdot 10^{-1}$, $k=-3.37$, and absolute values of $\alpha_2, \alpha_3, \alpha_4, \alpha_5, \alpha_6, \alpha_7, \alpha_8$ less than 1, and a fourth surface wherein $c=-2.42 \cdot 10^{-1}$, $k=2.38$, and absolute values of $\alpha_2, \alpha_3, \alpha_4, \alpha_5, \alpha_6, \alpha_7, \alpha_8$ less than 1; and a third aspheric lens following the second aspheric lens, having a refractive index 1.53, a fifth surface wherein $c=8.1 \cdot 10^{-1}$, $k=-4.03$, and absolute values of $\alpha_2 \alpha_3, \alpha_4, \alpha_5, \alpha_6, \alpha_7, \alpha_8$ less than 1, and a sixth surface wherein $c=5.17 \cdot 10^{-1}$, $k=-4.07$, and absolute values of $\alpha_2, \alpha_3, \alpha_4, \alpha_5, \alpha_6, \alpha_7, \alpha_8$ less than 1.

The present invention will be more fully understood from the following detailed description of the embodiments thereof, taken together with the drawings in which:

BRIEF DESCRIPTION OF THE DRAWINGS

FIG. 10 is a flowchart schematically describing procedures performed in designing a digital camera, in accordance with an embodiment of the present invention;

FIGS. 11A-11E schematically show results generated in the procedures of FIG. 10, in accordance with an embodiment of the present invention;

FIGS. 12A-12G show Modulation Transfer Function curves for an exemplary optical imaging assembly, in accordance with an embodiment of the present invention.

DETAILED DESCRIPTION OF EMBODIMENTS

Definitions

The following is a non-exhaustive list of technical terms that are used in the present patent application and in the claims. Although these terms are used herein in accordance with the plain meaning accorded the terms in the art, they are listed below for the convenience of the reader in understanding the following description and the claims.

Pitch of a detector array refers to the center-to-center distance between elements of the array.

Cylindrical symmetry describes a structure, such as a simple or compound lens, which has an optical axis such that the structure is invariant under rotation about the optical axis for any and all angles of rotation.

Point spread function (PSF) is the impulse response of an optical system in the spatial domain, i.e., the image formed by the system of a bright point object against a dark background Extent of the PSF is the full width at half maximum (FWHM) of the PSF.

Optical transfer function (OTF) is the two-dimensional Fourier transform of the PSF to the frequency domain. Because of the ease with which a PSF may be transformed into an OTF, and vice versa, computation of the OTF is considered to be equivalent to computation of the PSF for the purposes of the present invention.

Modulation transfer function (MTF) is the modulus of the OTF.

Optical radiation refers to electromagnetic radiation in any of the visible, infrared and ultraviolet regions of the spectrum.

System Overview

Figure 1:
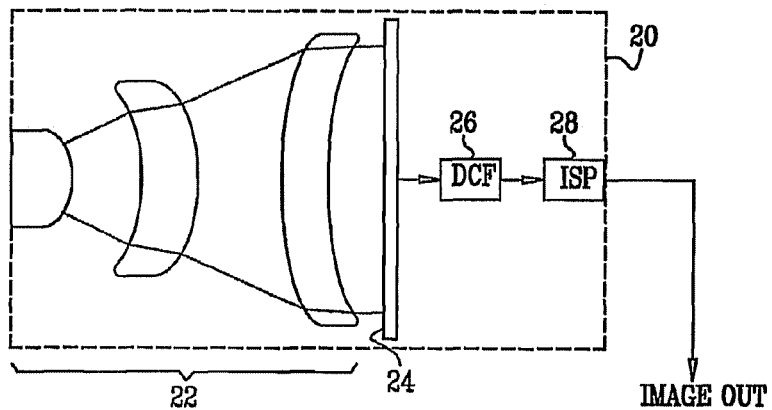
FIG. 1 is a block diagram that schematically illustrates a digital camera, in accordance with an embodiment of the present invention.

FIG. 1 is a block diagram that schematically illustrates a digital camera 20, in accordance with an embodiment of the present invention. The camera comprises refractive objective optics 22, which focus an image onto an image sensor 24, so that a surface of the sensor acts as a focal plane of the optics. Optics 22 are also referred to herein as optical imaging assembly 22. Optics 22 are designed in an iterative process together with a deconvolution engine 26 that operates on image data that are output by image sensor 24. The deconvolution engine applies one or more digital filters, typically comprising at least one deconvolution filter (DCF), to the image data. The design process and method of filtering are described in detail hereinbelow. The DCF kernel is typically chosen so as to correct for blur in the image formed by optics 22. After filtering, the image data are processed by an image signal processor (ISP) 28, which performs standard functions such as color balance and format conversion and outputs the resulting image.

The optical and digital processing schemes illustrated in FIG. 1 are shown here solely for the sake of example, as an aid to understanding the techniques and tools that are described hereinbelow. In practice, the principles of the present invention may be applied in conjunction with a wide variety of electronic imaging systems, using substantially any sort of optical design and substantially any type of image sensor, including both two-dimensional detector matrices and linear detector arrays, as are known in the art. Deconvolution engine 26 and ISP 28 may be implemented as separate devices or as a single integrated circuit component. In either case, the deconvolution engine and ISP are typically combined with other I/O and processing elements, as are known in the art. In the context of the present patent application, the term "digital camera" should therefore be understood as referring to any and all sorts of electronic imaging systems that comprise an image sensor, objective optics for focusing optical radiation onto the image sensor, and electronic circuits for processing the sensor output.

Figure 2:
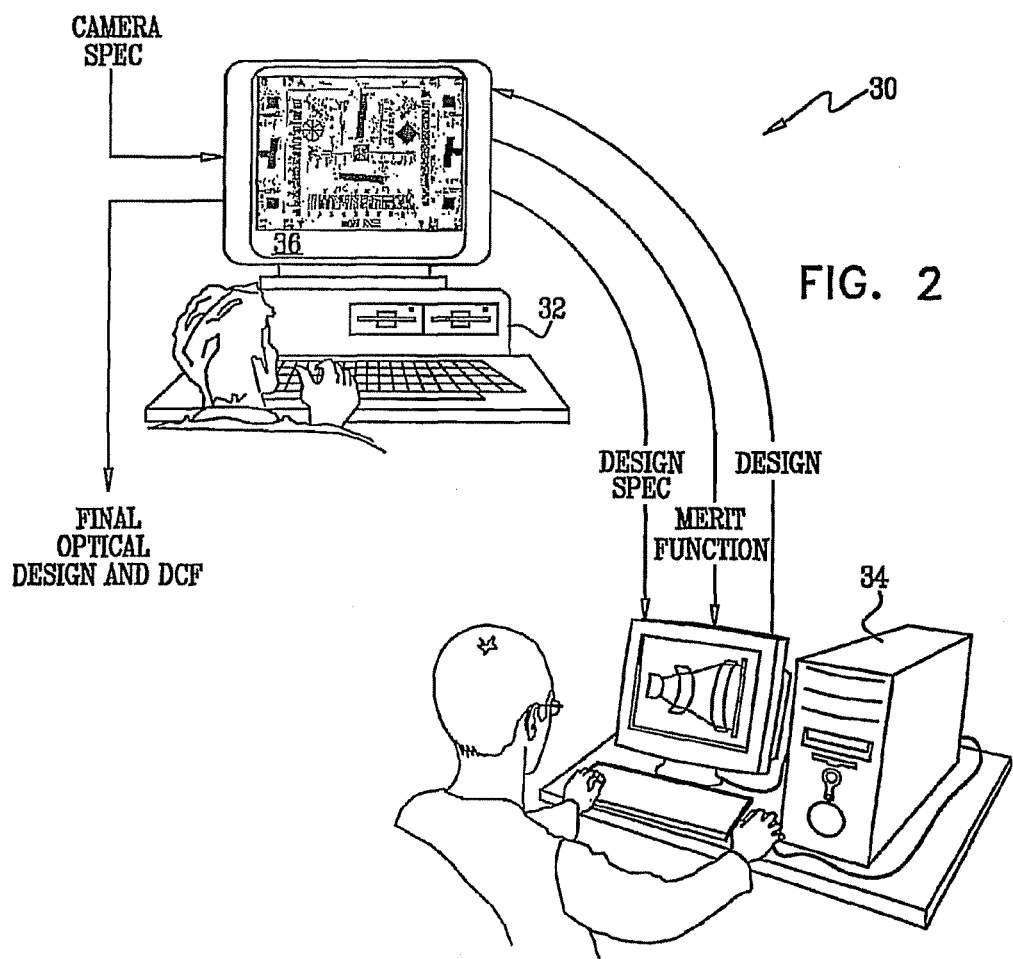
FIG. 2 is a schematic, pictorial illustration of a system for designing a digital camera, in accordance with an embodiment of the present invention.

FIG. 2 is a schematic, pictorial illustration showing a system 30 for designing a digital camera, in accordance with an embodiment of the present invention. System comprises a digital processing design station 32 and an optical design station 34. Processing design station 32 receives a camera specification as input, from a camera manufacturer, for example, specifying the key dimensions, sensor type and desired optical characteristics (referred to hereinafter as the target optical specification) of the camera. The specified optical characteristics may include, for example, the number of optical elements, materials, tolerances, focal length, magnification, aperture (F-number), depth of field, and resolution performance. The optical resolution performance is typically defined in terms of the MTF, but it may alternatively be specified in terms of PSF, wavefront quality, aberrations, and/or other measures of optical and image quality that are known in the art.

Processing design station 32 analyzes and modifies the target optical specification, taking into account the expected operation of engine 26, in order to provide a modified optical specification to the optical design station. Typically, both the original camera specification and the modified optical specification use cylindrically-symmetrical optical elements. Specialized phase plates or other elements that break the cylindrical symmetry of the optics are generally undesirable, due to their added cost, and engine 26 is able to correct the aberrations of optics 22 without requiring the use of such elements. In addition, processing design station 32 may compute and provide to optical design station 34 a merit function, indicating target values of the aberrations of optics 22 or scoring coefficients to be used in weighting the aberrations in the course of optimizing the optical design. The aberrations express deviations of the optical wavefront created by optics 22 from the ideal, and may be expressed, for example, in terms of Zernike polynomials or any other convenient mathematical representation of the wavefront that is known in the art.

Optical design station 34 is typically operated by a lens designer, in order to produce a lens design according to the modified optical specification provided by processing design station 32. The processing design station determines the optimal DCF (and possibly other filters) to be used in engine 26 in conjunction with this lens design. The DCF computation is tied to the specific lens design in question so that the filter coefficients reflect the "true" PSF of the actual optical system with which the DCF is to be used.

The processing design station then evaluates the optical design together with the DCF in order to assess the combined result of the expected optical quality of optics 22 and the enhancement expected from engine 26, and to compare the result to the target optical specification. The assessment may take the form of mathematical analysis, resulting in a quality score. A quality scoring schemes that may be used in this context is described hereinbelow. Alternatively, other quality scoring schemes may be used, such as that described, for example, in the above-mentioned PCT publication WO 2004/063989 A2. Alternatively or additionally, station 32 may generate and display a simulated image 36, which visually demonstrates the output image to be expected from the camera under design based on the current choice of optical specifications and DCF.

If the result of the analysis by station 32 indicates that the combined optical and DCF design will meet the target specifications, then the complete camera design, including optics and DCF, is output for production. Otherwise, the processing design station may perform further design iterations internally, or it may generate a further modified optical specification, which it passes to optical design station 34 for generation of a modified optical design. This process may continue iteratively until a suitable optical design and DCF are found. Details of this process are described hereinbelow with reference to FIG. 4.

Typically, stations 32 and 34 comprise general-purpose computers running suitable software to carry out the functions described herein. The software may be downloaded to the computers in electronic form, over a network, for example, or it may alternatively be furnished on tangible media, such as optical, magnetic, or electronic memory media. Alternatively, some of the functions of stations 32 and/or 34 may be implemented using dedicated or programmable hardware components. The functions of optical design station 34 may be carried out using off-shelf optical design software, such as ZEMAX® produced by ZEMAX Development Corp., San Diego, Calif.). Although stations 32 and 34 are shown and described, for the sake of conceptual clarity, as separate computer workstations, the functions of these stations may alternatively be combined in a single physical machine, running software processes for both optical design and digital processing design.

Figure 3A:
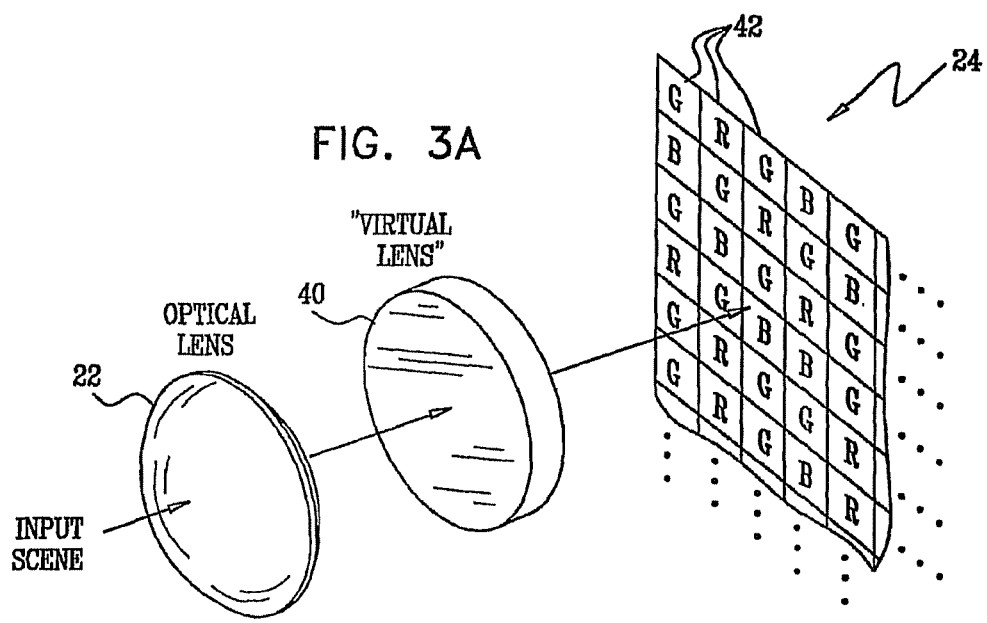
FIG. 3A is a schematic, pictorial illustration showing conceptual elements of a digital camera used in a design process, in accordance with an embodiment of the present invention.

FIG. 3A is a schematic, pictorial illustration showing conceptual elements of camera 20, as they are applied in the design process used in system 30, in accordance with an embodiment of the present invention. System 30 takes engine 26 into account in the design of optics 22, as explained hereinabove, and thus relates to the DCF as a sort of "virtual lens" 40. In other words, the design constraints on the actual objective optics are relaxed by the use of this virtual lens, as though the optical designer had an additional optical element to incorporate in the design for purposes of aberration correction. The virtual lens that is implemented in engine 26 is chosen, in conjunction with the actual optical lenses, to give an image output that meets the manufacturer's camera specifications.

Figure 3B:
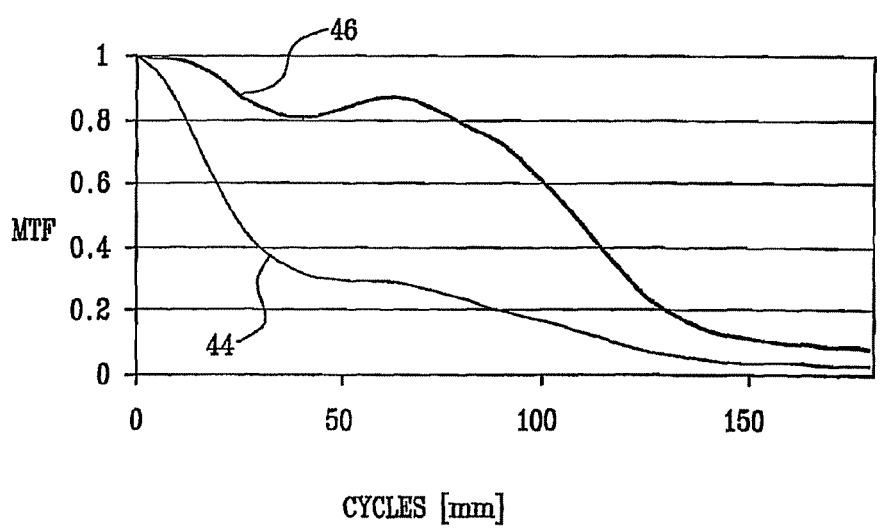
FIG. 3B is a plot of modulation transfer functions (MTF) for a digital camera with and without application of a deconvolution filter, in accordance with an embodiment of the present invention.

FIG. 3B is a plot showing the MTF of a camera designed using system 30, in accordance with an embodiment of the present invention. The plot includes an uncorrected curve 44, corresponding to the modified optical specification generated by station 32 for use in designing optics 22 on station 34. The low MTF permitted by curve 44 is indicative of the expected improvement in MTF that can be achieved by use of DCF 26. A corrected curve 46 shows the net MTF of the camera that is achieved by applying the DCF to the image sensor output. These curves show the MTF at the center of the optical field, with the object at a certain distance from the camera. In practice, the MTF may be specified at multiple different focal depths and field angles.

The design concept exemplified by FIGS. 3A and 3B permits the camera manufacturer to achieve the desired level of optical performance with fewer, smaller and/or simpler optical components than would be required to achieve the same result by optical means alone. Additionally or alternatively, the camera may be designed for enhanced performance, such as reduced aberrations, reduced F-number, wide angle, macro operation, or increased depth of field.

Detailed Design Process

Figure 4:
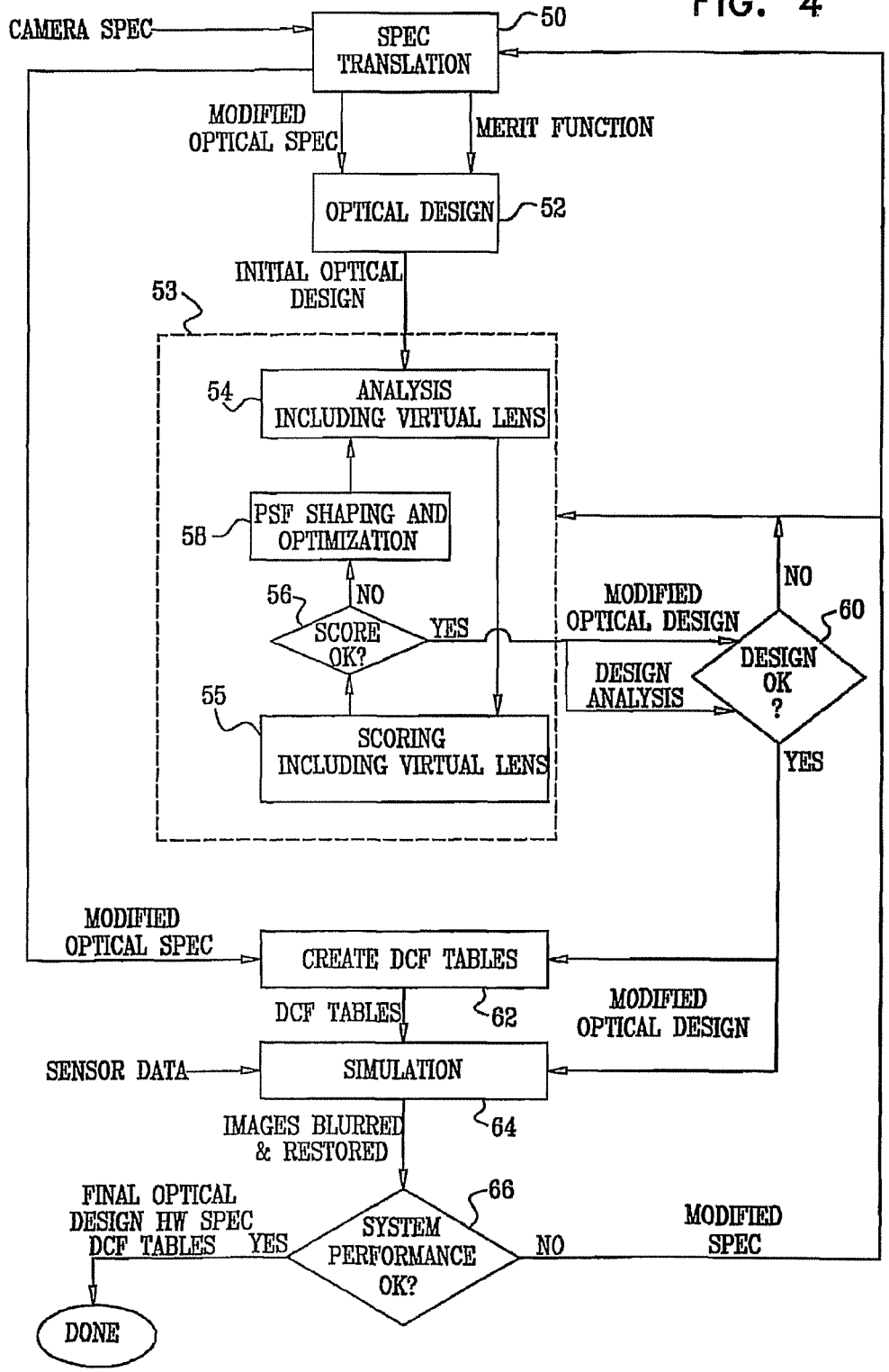
FIG. 4 is a flow chart that schematically illustrates a method for designing a digital camera, in accordance with an embodiment of the present invention.

FIG. 4 is a flow chart that schematically illustrates a method for designing a digital camera, in accordance with an embodiment of the present invention. The method will be described hereinbelow, for the sake of clarity, with reference to camera 20 and system 30, although the principles of this method may be applied generally to other cameras and using other design systems.

The point of departure of the design is the camera specification, as noted above. Processing design station 32 translates the target optical specification of the camera into a modified optical specification, at a specification translation step 50. For this purpose, station 32 uses an estimate of the DCF to be implemented in the camera. The image enhancement to be expected due to this DCF is then applied to the optical specification in order to estimate how far the optical design parameters, such as the MTF, can be relaxed.

Image enhancement by the DCF, however, tends to amplify noise in the output of image sensor 24. Generally speaking, the noise gain NG is proportional to the norm of the DCF ($\sqrt{D^t D}$, wherein D is the DCF kernel and the superscript t indicates the Hermitian transpose). Therefore, in estimating the DCF, and hence in estimating the degree to which the optical design parameters can be relaxed, the processing design station uses the maximum permissible noise gain as a limiting condition. Typically, engine 26 may also comprise a noise filter. The limit placed on the DCF coefficients by the noise gain may thus be mitigated by the noise reduction that is expected due to the noise filter. In other words, the norm of the DCF kernel is approximately given by the product of the maximum permissible noise gain with the expected noise reduction factor (i.e., the ratio of image noise following the noise filter to image noise without noise filtering). Alternatively, a more accurate estimate of the overall noise gain may be obtained by taking the norm of the product of the noise filter multiplied by the DCF in the frequency domain.

In order to determine the noise gain and permissible MTF reduction, the OTF may be assumed, at first approximation, to be linear as a function of spatial frequency q, which is normalized to the Nyquist frequency of image sensor 24:

$$OTF = 1 - \lambda q \} q \leq 1/\lambda$$
$$OTF = 0 \} q > 1/\lambda \quad (1)$$

The PSF may be determined analytically from the OTF of equation (1). Because of the zeroes in the OTF, the frequency-domain representation of the DCF to be used in the camera may be estimated as:

$$DCF = \frac{OTF}{OTF^2 + \alpha^2} \quad (2)$$

wherein α is a small number that keeps the DCF from exploding for small PSF.

The noise gain NG due to the DCF of equation (2) depends on the two parameters λ, α:

$$(NG)^2 = \frac{\pi}{\lambda^2} \left[ \frac{\arctan(1/\alpha)}{\alpha} - \ln\left(\frac{1}{\alpha^2} + 1\right) \right] \quad (3)$$

These parameters are chosen so that the noise gain does not exceed a target bound, for example, 300%. If the original camera specifications include a noise figure, the maximal permissible noise gain may be determined by comparing the expected noise characteristic of image sensor 24 to the noise specification. As noted above, digital smoothing of the noise in the output image may also be taken into account in order to permit the constraint on noise gain in the DCF to be relaxed.

Various noise removal methods, as are known in the art, may be used in engine 26. For example, a morphological operation may be used to identify edges in the image, followed by low-pass filtering of non-edge areas. The choice of noise removal method to be used in engine 26, however, is beyond the scope of the present invention.

Having chosen appropriate values of the parameters, the average MTF over the normalized frequency range [0,1] is given by:

$$MTF_{avg} = \frac{1}{\lambda}(1 - \alpha * \arctan(1/\alpha)) \quad (4)$$

The formulas given above in equations (3) and (4) apply for λ>1, which will be the case in most simple camera designs. Alternative estimates may be developed for high-resolution cameras in which λ<1. For α<<1, the noise gain may be expressed as a polynomial series in α or in the form:

$$NG^2 = \frac{\pi}{\lambda^2} \left( \frac{\pi^2}{4(1 - \lambda * MTF_{avg})} - 2\ln\left(\frac{\pi}{2(1 - \lambda * MTF_{avg})}\right) \right) \quad (5)$$

Other representations will be apparent to those skilled in the art.

Equations (4) and (5) may be used in estimating how far the MTF of optics 22 may be reduced relative to the original target specification, subject to a given noise gain limit. This reduction factor may be applied, for example, to the MTF required by the original camera specification at a benchmark frequency, such as half the Nyquist frequency. In the example shown in FIG. 3B, the target MTF has been reduced to about ⅓ of its original specified value. The MTF will be restored in the output image from camera 20 by operation of the DCF in engine 26.

Referring back now to FIG. 4, processing design station 32 may also generate a merit function at step 50 for use by the optical designer. The merit function may take the form of aberration scores, which are assigned to each significant aberration that may characterize optics 22. For this purpose, the aberrations may be expressed, for example, in terms of the Zernike polynomials, for each of the colors red, green and blue individually. Standard software packages for optical design, such as ZEMAX, are capable of computing the Zernike polynomial coefficients for substantially any design that they generate. Values of the merit functions may be provided in tabular form. Generation of these values is described in detail in the above-mentioned PCT Publication WO 2004/063989 A2.

Alternatively or additionally, processing design station 32 may generate target wavefront characteristics that the optical design should achieve in the image plane (i.e., the plane of sensor 24). These wavefront characteristics may conveniently be expressed in terms of values of the aberrations of optics 22, such as Zernike coefficient values. Typically, aberrations that can be corrected satisfactorily by deconvolution engine 26 may have high values in the optical design, whereas aberrations that are difficult to correct should have low values. In other words, an aberration that would have a high score in the merit function will have a low target value, and vice versa. The target aberration values can be seen as the inverse of the wavefront corrections that can be achieved by "virtual lens" 40. The target aberration values may also include aberrations that reduce the sensitivity of the optics to various undesirable parameters, such as manufacturing deviations and defocus.

An optical designer working on station 34 uses the specification, along with the merit function and/or aberration target values provided at step 50, in generating an initial design of optics 22, at an optical design step 52. The designer may use the merit function in determining a design score, which indicates how to trade off one aberration against another in order to generate an initial design that maximizes the total of the merit scores subject to the optical specification. Additionally or alternatively, the optical designer may insert a dummy optical element, with fixed phase characteristics given by the target aberration values as an additional element in the optical design. This dummy optical element expresses the wavefront correction that is expected to be achieved using engine 26 and thus facilitates convergence of the calculations made by the optical design software on station 34 to the desired design of the elements of optics 22.

Control of the design process now passes to processing design station 32, in a design optimization stage 53. The processing design station analyzes the optical design, at a design analysis step 54. The analysis at this step may include the effect of virtual lens 40. At step 54, station 32 typically computes the optical performance of the optics as a function of wavelength and of location in the image plane. For example, station 32 may perform an accurate ray trace computation based on the initial optical design in or to calculate a phase model at the image plane, which may be expressed in terms of Zernike polynomial coefficients. The total aberration—and hence the PSF—at any point in the image plane may be obtained from the total wavefront aberration, which is calculated by summing the values of the Zernike polynomials.

Station 32 determines a design quality score, at a scoring step 55. Typically, this score combines the effects of the PSF on image resolution and on artifacts in the image, and reflects the ability of engine 26 to compensate for these effects. The score measures the extent to which the current optical design, taken together with filtering by engine 26, will satisfy the camera specification that was originally provided as input to station 32 as input to step 50.

In an exemplary embodiment, the score computed at step 55 is based on the camera specification and on a set of weights assigned to each parameter in the camera specification. The camera specification is expressed in a list of desired parameter values at various image plane locations and wavelengths, such as:

MTF
Geometrical distortion
Field of view
Chromatic aberrations
Chief ray angle
F-number
Relative illumination
Artifact level
Glare
Back focal length
Manufacturing tolerances
Depth of field
Noise level
Total length of optics.

The weight assigned to each parameter is typically determined by its scaling, subjective importance, and likelihood of satisfying the desired parameter value relative to other parameters.

The overall score is computed by summing the weighted contributions of all the relevant parameters. In this embodiment, if a given parameter is within the specified range, it makes no contribution to the score. If the value is outside the specified range, the score is decreased by the square difference between the parameter value and the closest permissible value within the specified range, multiplied by the appropriate weight. A design that fully complies with the camera specification will thus yield a zero score, while non-compliance will yield negative values. Alternatively, other parameters and other methods may be used in computing numerical values representing how well the current design satisfies the camera specification.

The score computed at step 55 is assessed to determine whether it indicates that the current design is acceptable, at a quantitative assessment step 56. If the design does not meet the specification, station 32 modifies the optical design parameters at an optimization step 58. For this purpose, the station may estimate the effects of small changes in the aberrations on the PSF. This operation gives a multi-dimensional gradient, which is used in computing a change to be made in the optical design parameters by linear approximation. The DCF parameters may be adjusted accordingly. A method for computing and using gradients of this sort is described, for example, in the above-mentioned PCT Publication WO 2004/063989 A2. The results of step 58 are input to step 54 for recomputation of the optical performance analysis. The process continues iteratively through steps 55 and 56 until the design quality score reaches a satisfactory result.

Once the design has converged, the design parameters are presented by processing design station 32 to the system operator, at a design checking step 60. Typically, the system operator reviews the optical design (as modified by station 32 in step 58, if necessary), along with the results of the design analysis performed at step 54. Additionally or alternatively, the optical design and DCF may be used at this point in generating a simulated output image, representing the expected performance of the camera in imaging a known scene or test pattern. (Exemplary simulated images of this sort are shown below in FIGS. 6 and 7.) The system operator reviews the design in order to verify that the results are indeed satisfactory for use in manufacture of camera 20. If not, the operator may change certain parameters, such as specification parameters and/or scoring weights, and return to stage 53. Alternatively, if it appears that there are serious problems with the design, the operator, may initiate changes to the original camera specification and return the process to step 50. This sort of operator involvement may also be called for if stage 53 fails to converge to an acceptable score at step 56.

Once the design is found to be acceptable, processing design station 32 generates tables of values to be used in camera 20, at a DCF creation step 62. Typically, because of the non-uniform performance of optics 22, the DCF tables vary according to location in the image plane. In an exemplary embodiment, a different DCF kernel is computed for each region of 50×50 pixels in image sensor 24.

Furthermore, when sensor 24 is a color image sensor, different kernels are computed for the different color planes of sensor 24. For example, referring back to FIG. 3A, common mosaic image sensors may use a Bayer pattern of red, green, and blue pixels 42. In this case, the output of the image sensor is an interleaved stream of sub-images, comprising pixel samples belonging to different, respective colors. DCF 26 applies different kernels in alternation, so that the pixels of each color are filtered using values of other nearby pixels of the same color. Appropriate kernel arrangements for performing this sort of filtering are described in U.S. Provisional Patent Application 60/735,519, filed Nov. 10, 2005, which is assigned to the assignee of the present patent application and is incorporated herein by reference.

Figure 5A:
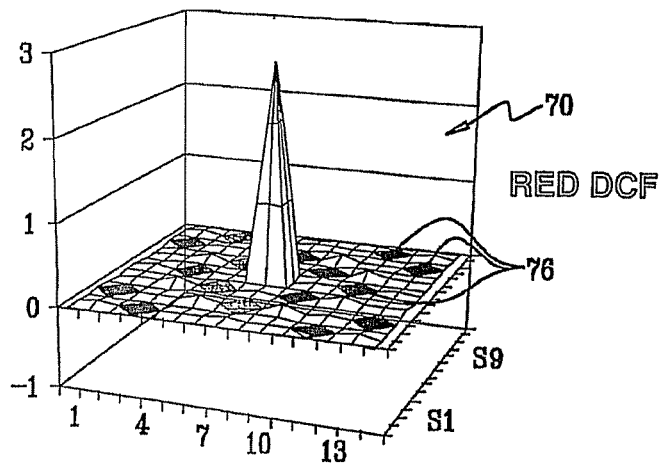
FIGS. 5A-5C axe schematic, perspective plots of DCF kernels used in a digital camera, in accordance with an embodiment of the present invention.
Figure 5B:
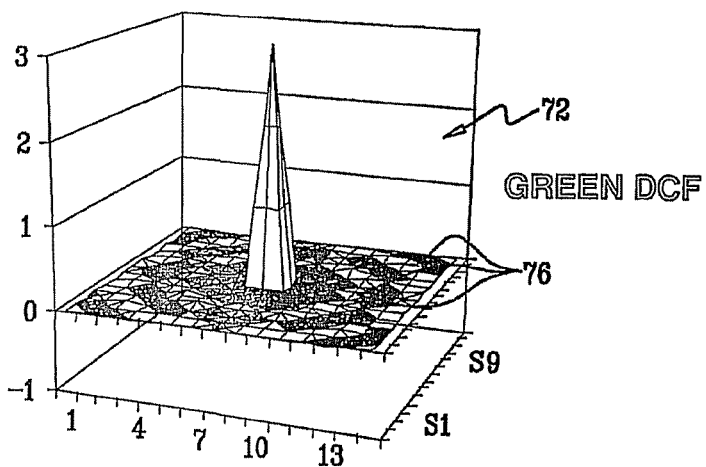
Figure 5C:
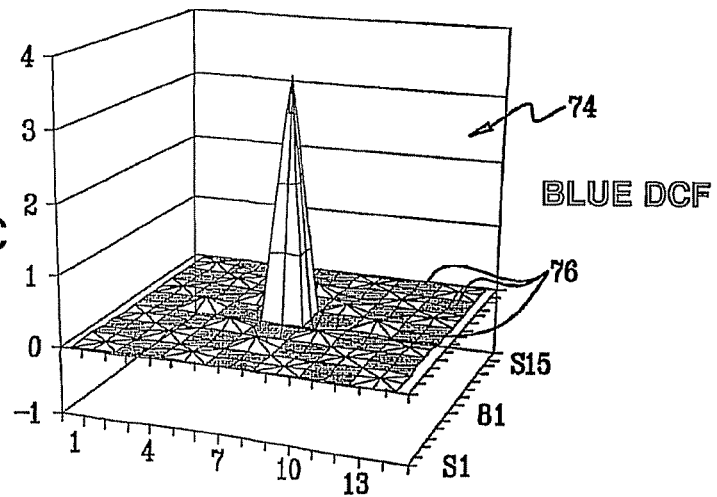

FIGS. 5A, 5B and 5C are schematic, perspective plots of DCF kernels 70, 72 and 74 for red, green, and blue pixels, respectively, which are computed in accordance with an embodiment of the present invention. Each kernel extends over 15×15 pixels, but contains non-zero values only at pixels of the appropriate color. In other words, in red kernel 70, for example, in each square of four pixels, only one—the red pixel—has a non-zero value. Blue kernel 74 is similarly constructed, while green kernel 72 contains two non-zero values in each four-pixel square, corresponding to the greater density of green pixels in the Bayer matrix. In each kernel, the central pixel has a large positive value, while surrounding values are lower and may include negative values 76. As explained above, the DCF values are chosen so that the norm does not exceed the permitted noise gain.

Referring back to FIG. 4, design station 32 uses the DCF tables from step 62 and the optical design output from stage 53 in simulating the performance of camera 20, at a simulation step 64. The simulation may also use characteristics, such as noise figures, of image sensor 24 that is to be installed in the camera, as well as other factors, such as manufacturing tolerances to be applied in producing the camera and/or operation of ISP 28. The results of this step may include simulated images, like image 36 (FIG. 2), which enable the system operator to visualize the expected camera performance.

Figure 6:
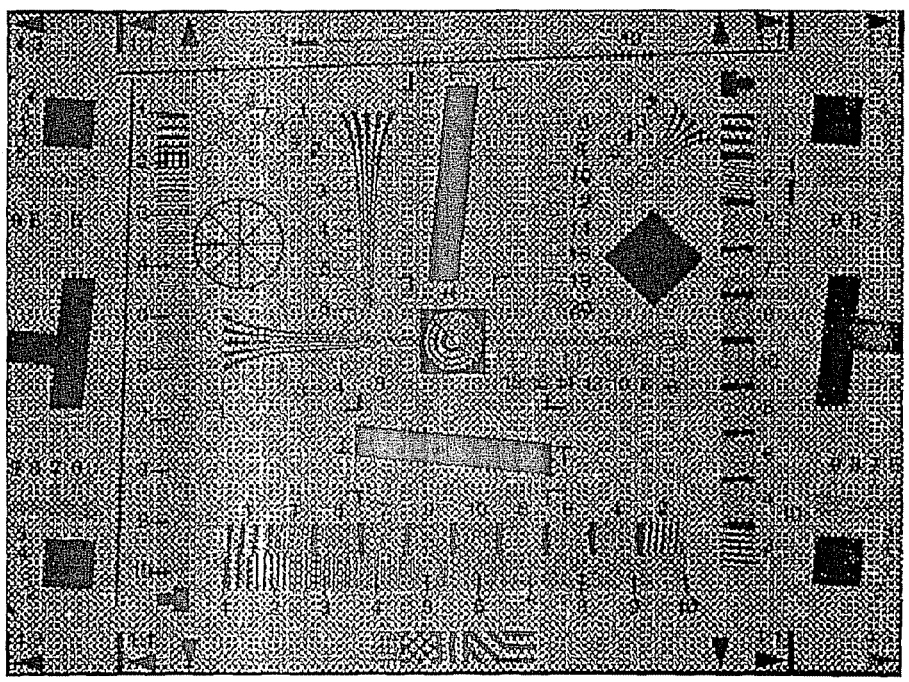
FIG. 6 is an image that simulates the output of an image sensor using objective optics with specifications that have been relaxed in accordance with an embodiment of the present invention.
Figure 7:
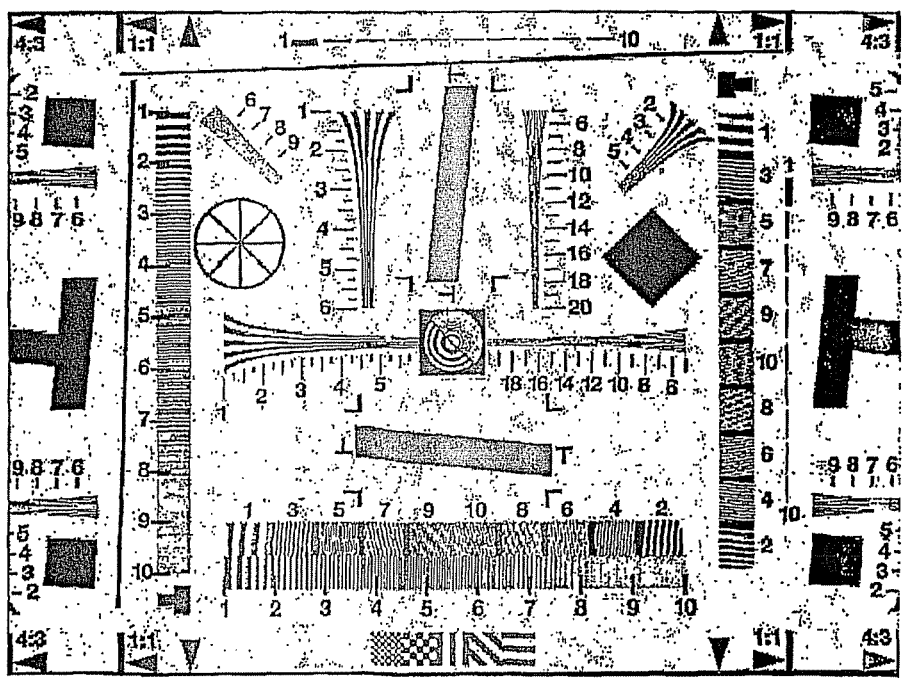
FIG. 7 is an image that simulates the effect of application of an appropriate DCF to the image of FIG. 6, in accordance with an embodiment of the present invention.

FIGS. 6 and 7 are images that simulate the expected output of camera 20, as may be generated at step 64, in accordance with an embodiment of the present invention. FIG. 6 shows a standard test pattern as it would be imaged by optics and captured by image sensor 24, without the use of DCF 26. The image of the test pattern is blurred, especially at higher spatial frequencies, due to the low MTF of camera 20. (The MTF is given roughly by uncorrected curve 44 in FIG. 3B.) In addition, the image pixels are decimated due to the use of a color mosaic, sensor, and random noise is added to the image corresponding to the expected noise characteristics of the image sensor.

FIG. 7 shows the image of FIG. 6 after simulation of processing by DCF 26, including noise removal as described hereinbelow. The MTF of this image is given roughly by curve 46 in FIG. 3B. (The aliasing apparent in the images of the high-frequency test patterns is the result of a true simulation of the performance of a low-resolution image sensor following DCF processing.) The system operator, viewing this image, is able to ascertain visually whether the camera performance will meet the original camera specifications that were provided at step 50.

The system operator's visual assessment is combined with the numerical results of the design analysis, in order to determine whether the overall performance of the design is acceptable, at an acceptance step 66. If there are still flaws in the simulated image or in other design quality measures, the design iteration through stage is repeated, as described above. Alternatively, in case of serious flaws, the camera specification may be modified, and the process may return to step 50. Otherwise, system 30 outputs the final optical design and DCF tables, together with other aspects of the hardware circuit implementation of the camera (such as a netlist of engine 26), and the design process is thus complete.

Optionally, after prototypes of optics 22 have been fabricated, the DCF tables may be tested and modified in a test-bench calibration procedure. Such a procedure may be desirable in order to correct the DCF for deviations between the actual performance of the optics and the simulated performance that was used in the design process of FIG. 4. A calibration procedure that may be used for this purpose is described in the above-mentioned provisional application.

Zernike Polynomials

As stated above, optic aberrations may be quantified in terms of coefficients of the Zernike polynomials. The Zernike polynomials are described, for example, by Born & Wolf in *Principles of Optics*, 7$^{th}$ edition (Cambridge University Press, 2002), in section 9.2, pages 523-527, and in Appendix VII, pages 905-910, which are incorporated herein by reference. Table I below lists different Zernike polynomials:

TABLE I

| Polynomial | Name | Notes |
|---|---|---|
| Z1 | Piston | Mean value of the wavefront |
| Z2 | X-tilt | Deviation in the sagittal direction |
| Z3 | Y-tilt | Deviation in the tangential direction |
| Z4 | Defocus | Quadratic term due to out of focus |
| Z5 | X-astigmatism | Horizontally oriented cylinder and out of focus |
| Z6 | Y-astigmatism | Vertically oriented cylinder and out of focus |
| Z7 | X-coma | Comatic flaring in the n-direction |
| Z8 | Y-coma | Comatic flaring in the y-direction |
| Z9 | Third order spherical | Third order spherical aberration, and defocus |
| Z10-Z16 | Fifth order aberrations | |
| Z17-Z25 | Seventh order aberrations | |
| Z26-Z36 | Ninth order aberrations | |
| Z37 | 11$^{th}$ order aberration | |

As shown in Table I, Z4 and Z9 contribute to spherical aberrations. In addition, Z16, Z25, Z36, and Z37 also contribute to spherical aberrations. Z1, Z2, and Z3 do not contribute to loss of resolution of the imaging system.

Extended Depth of Field

Figure 8:
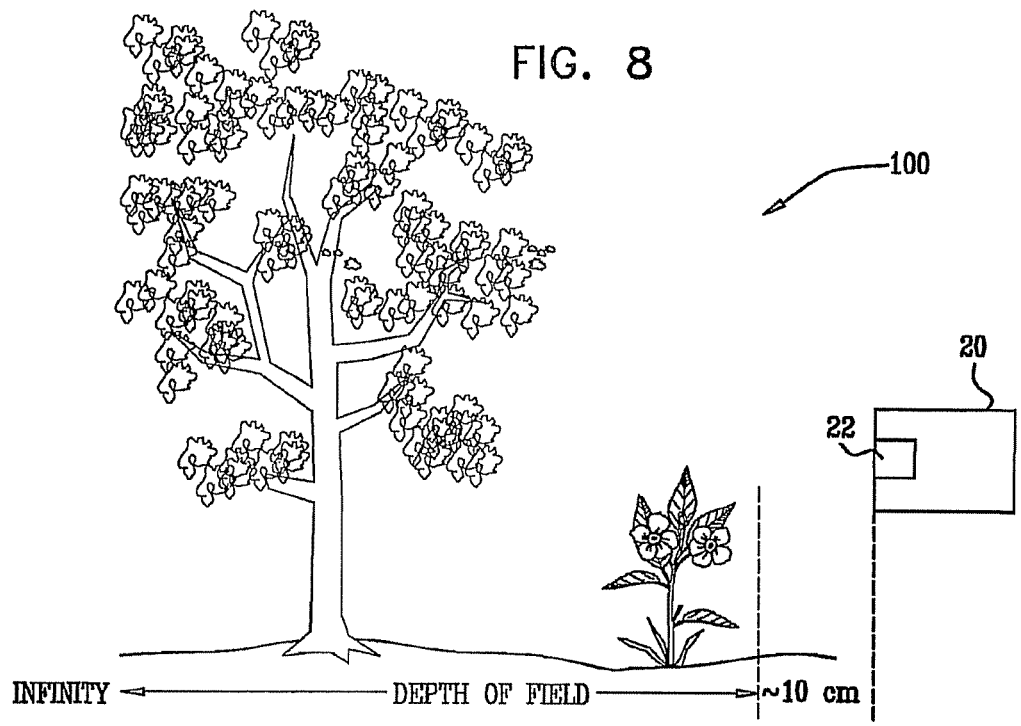
FIG. 8 is a schematic pictorial representation of a camera imaging a large depth of field, in accordance with an embodiment of the present invention.

FIG. 8 is a schematic pictorial representation of camera 20 imaging a large depth of field, in accordance with an embodiment of the present invention. In the following description, unless otherwise stated, it is assumed that the iterative detailed design process described above with reference to FIG. 4, and the design procedures described below with reference to FIG. 10, are followed. Also in the following description, the specifications of Tables II, III, IV, V, and VI are exemplary, and it will be understood that embodiments of the present invention provide numerous camera assemblies having a large depth of field.

A camera specification, corresponding to that provided to design station 32 (FIG. 1) at step 50 (FIG. 4), is assumed to include cylindrically symmetric optics 22 having an F-number of 2.8. The optics are to be produced using spherical or non-logarithmic aspherical surfaces. The specification also includes a depth of field (DOF), for objects in a scene 100, from approximately 10 cm to infinity. The DOF is the range of object distances from camera 20 for which the image generated by the camera has an extent of an equivalent PSF, i.e., a PSF of an image produced by ISP 28 (FIG. 1), that is less than or equal to approximately 5 µm. A more complete specification provided to step 50 is given in Table II below.

TABLE II

| Parameter | Value |
|---|---|
| Depth of Field | 10 cm-infinity |
| F-number | 2.8 |
| Field of View | 58°-62° |
| Lens Total Track | <6.4 mm |
| Approximate Focal Length | 4.3 mm |
| Back Focal Length | >1.5 mm (includes an IR filter between the final lens and the sensor) |
| Sensor: 1/3" 2M CMOS | |
| Active Imager Size | 4.48 mm (H) 3.36 mm (V), 5.60 mm diagonal |
| Active Pixels | 1600 (H) 1200 (V) |
| Pixel Size | 2.8 µm (H) 2.8 µm (V) |

In prior art systems, the depth of field of a camera is related to the F-number of the camera lens so that, for example, an F/2.8 lens has a largest depth of field when focused at the hyperfocal distance of the lens. In this case a depth of field of a 4.3 mm focal length lens is from infinity to of the order of 50 cm from the camera.

In addition to the specification generated in step 50, Zernike polynomial coefficient values shown in Table III are provided for continuing to optical design step 52. The description hereinbelow assumes that the coefficient values are for Zernike fringe coefficients, Those skilled in the art will be able to convert the values for the fringe coefficients to Zernike standard coefficients, without undue experimentation.

TABLE III

| Zernike Polynomial | Fringe Coefficient |
|---|---|
| Z4 | 0.9 |
| Z9 | 0 |
| Z16 | −0.2 |
| Z25 | −0.5 |
| Z36 | 0 |
| Z37 | 0.2 |

Figure 9:
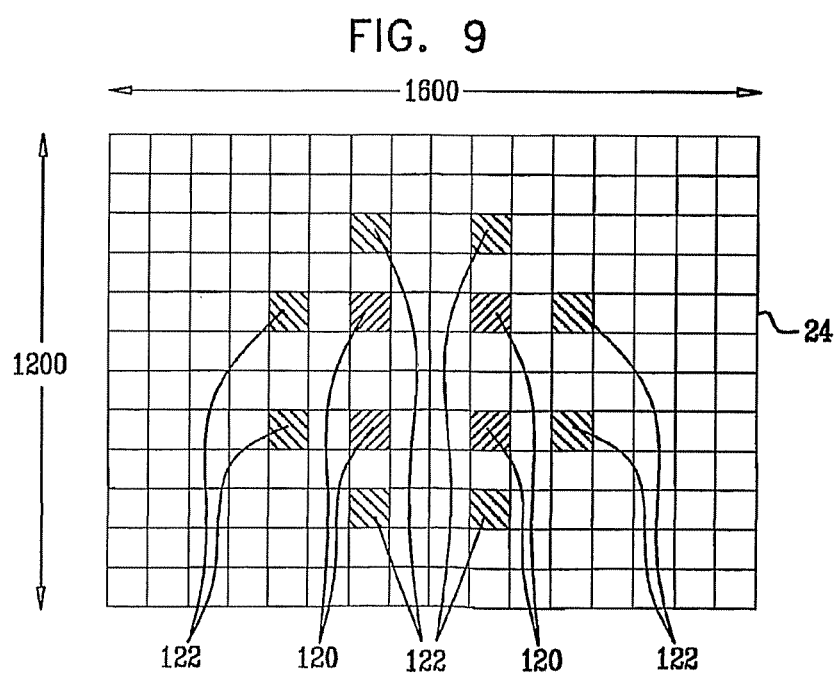
FIG. 9 schematically shows detail of a camera sensor, in accordance with an embodiment of the present invention.

FIG. 9 shows detail of sensor 24, in accordance with an embodiment of the present invention. Sensor 24 comprises an array of 1200×1600 pixels, which deconvolution engine 26 processes as 192 sub-arrays of 100×100 pixels. Because of the non-uniform performance of optics 22 over sensor 24, as described above, deconvolution engine 26 applies a different 15×15 pixel DCF kernel (FIGS. 5A, 5B, 5C) to each sub-array. However, since optics 22 are cylindrically symmetric, the same DCF kernel may be applied to groups of four or eight sub-arrays of sensor 24. For example, the four sub-arrays 120 are all symmetric with respect to the center of sensor 24, and so engine 26 may apply the same DCF kernel to the four. Similarly, the eight sub-arrays 122 are also symmetric with respect to the center, so that engine 26 may apply the same DCF kernel to the eight. Inspection of the sub-arrays of sensor 24 shows that 33 different DCF kernels suffice for engine 26 to process the complete sensor. Each DCF kernel applies to a group of sub-arrays, and each sub-array in a given group subtends the same angle to the optic axis of the camera.

The DCF kernels are iteratively created in step 62, typically using iterations of the optical design as described herein.

In an alternative embodiment of the present invention, sensor 24 is considered as 768 sub-arrays of 50×50 pixels. In the alternative embodiment, deconvolution engine applies 768 respective DCF kernels to the sub-arrays. An example of a DCF kernel for the alternative embodiment, for a corner 50×50 array, is given in the matrix below.

$$\begin{pmatrix} 2 & 8 & 1 & -1 & 2 & 14 & 1 & 10 & 1 & 19 & 2 & 11 & 0 & 6 & 0 \\ 0 & -2 & 10 & 0 & -13 & 1 & 23 & 0 & 23 & -1 & 10 & 0 & 0 & -1 & -5 \\ 3 & 21 & -2 & -21 & -3 & -25 & -1 & -4 & 1 & -3 & 0 & -11 & -1 & 2 & 1 \\ 0 & 2 & 31 & -5 & -23 & -13 & -151 & -11 & -165 & -4 & -49 & 0 & 33 & 0 & -6 \\ 3 & 7 & 0 & -15 & -8 & 33 & -34 & -182 & -29 & -163 & -3 & -76 & 1 & 13 & 2 \\ 0 & -4 & -41 & -5 & -6 & 25 & 161 & -38 & 330 & -17 & -125 & 3 & 31 & -1 & 9 \\ 3 & 14 & -7 & -16 & -8 & -123 & 93 & 401 & 70 & 470 & -12 & -18 & 2 & -8 & 3 \\ 0 & 0 & 14 & -15 & -199 & -52 & 304 & 358 & 479 & -37 & -176 & -1 & -7 & -1 & 15 \\ 1 & 26 & 0 & 14 & -25 & -171 & 62 & 136 & -42 & 177 & -22 & -144 & 1 & -9 & 3 \\ 0 & -1 & 33 & -1 & -90 & -26 & -35 & -19 & -81 & -29 & -129 & -3 & -3 & -2 & 17 \\ 0 & 12 & 0 & 3 & -8 & -55 & -9 & 4 & -20 & -45 & -3 & -58 & -5 & 18 & 4 \\ 0 & -1 & 0 & 0 & 1 & 1 & -7 & 0 & 9 & 1 & -11 & -3 & -13 & -4 & 13 \\ 0 & 7 & -1 & -1 & 0 & 3 & 1 & -8 & 1 & -8 & 1 & 7 & -5 & -15 & 3 \\ 0 & -1 & -2 & 0 & 6 & 0 & 9 & 1 & 13 & 1 & 8 & -1 & 1 & -1 & 10 \\ 0 & 0 & 1 & 0 & 2 & 0 & 3 & 0 & 3 & 0 & 2 & 0 & 1 & 0 & 3 \end{pmatrix}$$

The matrix above corresponds to a sub-array which subtends 33 degrees to the optic axis of the camera. Those having ordinary skill in the art will be able to produce DCF kernels for sub-arrays subtending other angles to the optic axis, by the iterative methods described herein. In one embodiment, application of the matrix above over other sub-arrays of sensor 24 yielded satisfactory results.

In one embodiment of the present invention, the initial optical design uses a virtual or dummy phase element, as described above with reference to step 52, and as exemplified below with reference to the flowchart of FIG. 10. The virtual phase element is formed to have Zernike coefficients with the same absolute value as those of Table III, but with opposite sign.

Figure 11A:
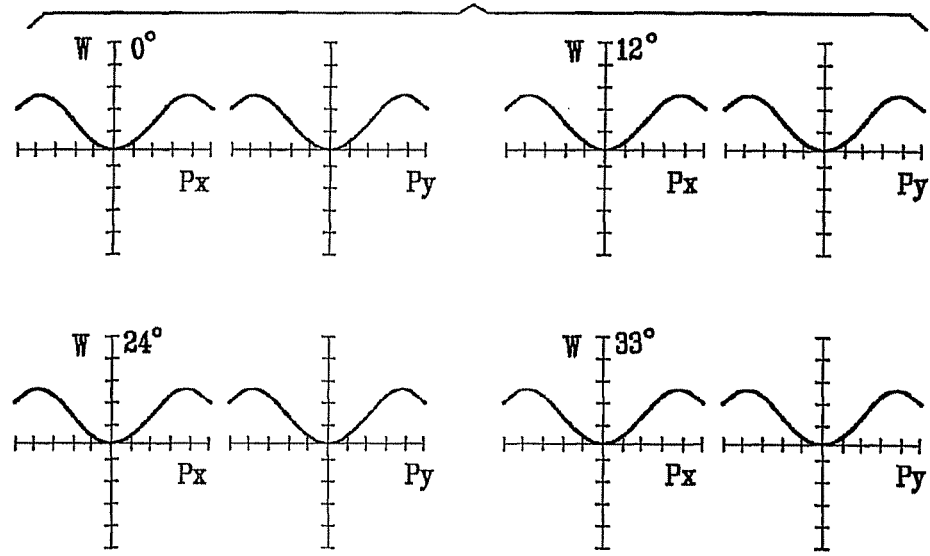
Figure 11B:
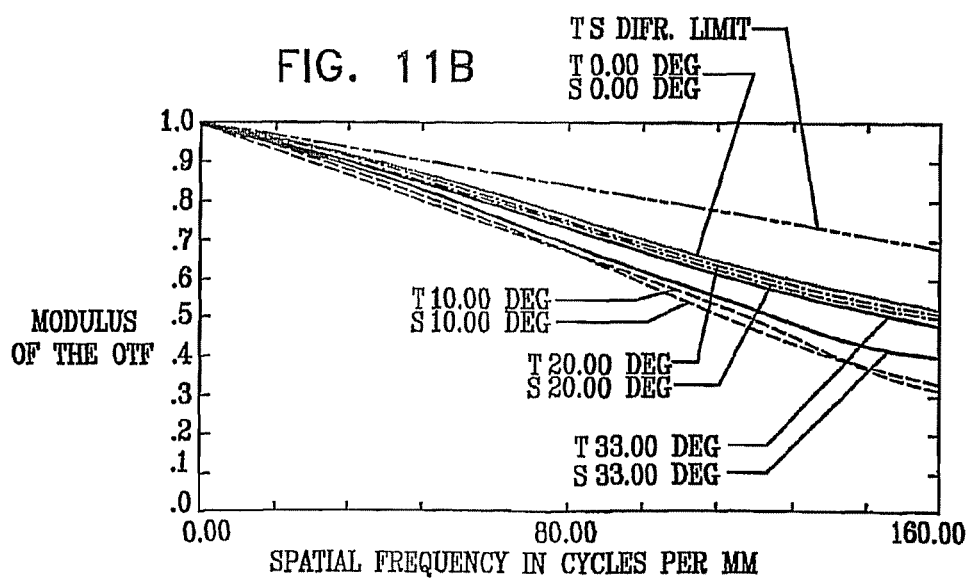

FIG. 10 is a flowchart describing procedures performed in steps 52 and 53 (FIG. 4), and FIGS. 11A, 11B, ..., 11E, show results generated in the procedures, in accordance with an embodiment of the present invention. In a modeling procedure 132, to evaluate the feasibility of the optical design, the optical designer may initially generate results for an ideal lens with a focal length corresponding the specification of Table II, together with a phase element having opposite Zernike coefficients to those of Table III. In the following description, it is assumed that the specification is as given below for Table IV, with Zernike coefficients as given below in Table V.

TABLE IV

| Parameter | Value |
| --- | --- |
| Depth of Field | 10 cm-infinity |
| F-number | 2.8 |
| Field of View | Approximately 66° |
| Lens Total Track | <4.6 mm |
| Approximate Focal Length | 3.3 mm |
| Back Focal Length | >1.2 mm |
| Sensor: ⅓" 2M CMOS | |
| Active Imager Size | 4.48 mm (H) 3.36 mm (V), 5.60 mm diagonal |
| Active Pixels | 1600 (H) 1200 (V) |
| Pixel Size | 2.8 μm (H) 2.8 μm (V) |

TABLE V

| Zernike Polynomial | Fringe Coefficient |
| --- | --- |
| Z4 | 0.3 |
| Z9 | −0.4 |
| Z16 | 0.1 |
| Z25 | 0.0 |
| Z36 | 0.0 |
| Z37 | 0.0 |

An example of results generated in procedure 132 is given in FIG. 11A.

FIG. 11A shows graphs of optical path differences (OPDs) for an ideal lens of focal length 3.3 mm combined with a phase element, in accordance with an embodiment of the present invention. The OPD graphs plot the number of wavefronts (W) vs. PX, PY (μm) at wavelengths 486 min and 656 nm. Inspection of the graphs shows that they are relatively smooth, so that it is likely that a final optical design corresponding to the specifications of Tables IV and V will be successful. In the event that the graphs are not smooth, the final design may not be successful, so that a change in the specifications may be advisable.

Returning to FIG. 10, in a classical design procedure 134, the optical designer generates a best version of the lens assembly according to the initial specifications, but ignoring the aberration specifications. It will be understood that for any given set of specifications, there are many possible assemblies that may be considered, and that there are also many practical constraints. For example, the number of lenses may be varied, although typically the fewer the lenses the lower the cost. Alternatively or additionally, the parameters associated with the lens manufacture, such as a maximum angle made by a surface of the lens relative to the optic axis, may be varied, although typically this may not be more than 55°. From these assemblies and with regard to the constraints, the designer selects a best version, and simulates results produced by the version. The results typically include MTF curves, spot diagrams, and Zernike polynomial coefficients. The MTF values are typically high, corresponding to the overall good image quality generated for a best version, whereas the spot diagrams and/or coefficient distributions may be poor. Typical MTF results of the classical design procedure are shown in FIG. 11B.

In a modified classical procedure 136, the designer attempts to improve the spot diagrams and/or coefficient distributions, typically at the cost of reducing the MTF values. The improvement is usually achieved by applying merit functions to the Zernike coefficients, to attempt to reduce the coefficients to zero over the complete field of view of the assembly. The application of merit functions is described above. Comparison of the results shown in FIG. 11C with those of FIG. 11B shows that zeroing the Zernike coefficients in procedure 136 reduces the MTF values.

In a Zernike design procedure 138, a phase element with Zernike coefficients having the same values as those of Table V is applied to the version produced in procedure 136. Typically, a number of designs are produced incorporating the phase element, and each of the designs is adjusted to attempt to zero the final Zernike coefficients. Zeroing the final Zernike coefficients normally reduces the MTF of the design. A best design is chosen from the designs found in this stage. FIG. 11D shows examples of different MTF curves that may be produced by procedure 138.

In a refinement procedure 140, the phase element is removed from the best design chosen in procedure 138. The resulting design gives results shown in FIG. 11E and, as expected, the Zernike coefficient values are close to those of the initial request. The resulting design may be further refined to attempt to bring the coefficients closer to the initial request. FIG. 11E shows examples of MTF curves and values of Zernike coefficients before and after the refinement procedure. In both the design and the refinement procedures, in addition to bringing the Zernike coefficients close to the initial request, the design is adjusted so that the MTF curves are all approximately the same shape. The conditions on the MTF curves, that the design meets, are described in more detail with respect to FIGS. 12A-12G below.

The inventors have found that application of the procedures given in FIG. 10, together with the steps described in FIG. 4, gives a camera having a depth of field from approximately 10 cm to infinity. The resulting value of Z4 is typically between approximately 0.6 and approximately 0.9, but the inventors have found that Z4>approximately 0.1 gives good results, and that deconvolution engine 26 may be configured to satisfactorily correct the aberrations produced corresponding to these values of Z4, and to other non-zero values of the Zernike coefficients. In addition, typically the coefficients of Z9, the third order spherical aberration, are between approximately 0 and approximately −0.2, the coefficients of Z16, the fifth order spherical aberration, are between approximately −0.1 and approximately −0.3, the coefficients of Z25, the seventh order spherical aberration, are between approximately −0.4 and approximately −0.6, and the coefficients of Z36, the ninth order spherical aberration, are between approximately 0 and approximately 0.2. The aberrations give an extent of the PSF that is typically greater than or equal to approximately 5 pixels, i.e., 14 μm, on sensor 24.

FIGS. 12A-12G shows MIT curves for an exemplary optical imaging assembly 152, in accordance with an embodiment of the present invention. Exemplary assembly 152 is described in more detail with reference to FIG. 13 below, and is one example of assembly 22. Assembly 152 is designed according to the steps and procedures of FIGS. 4 and 10. The MTF curves may be produced during, and/or at the conclusion of, the design.

Figure 12A:
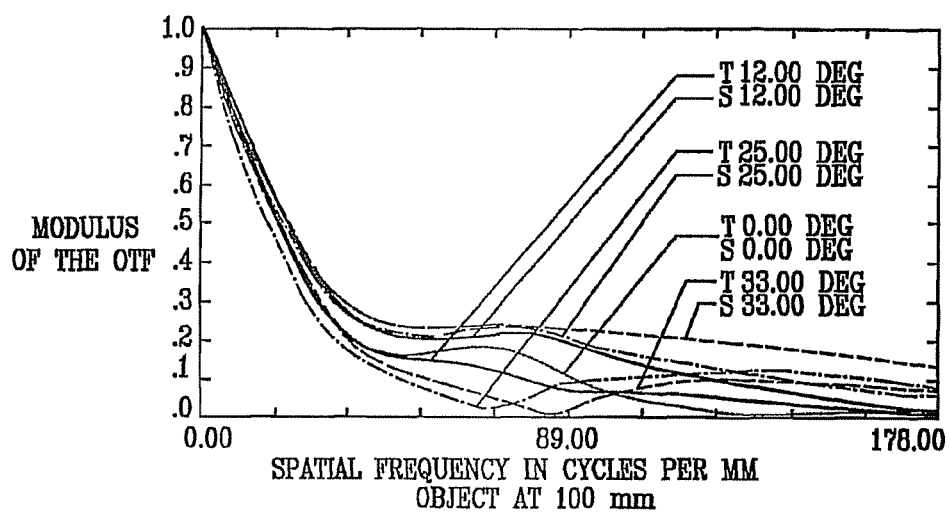
Figure 12B:
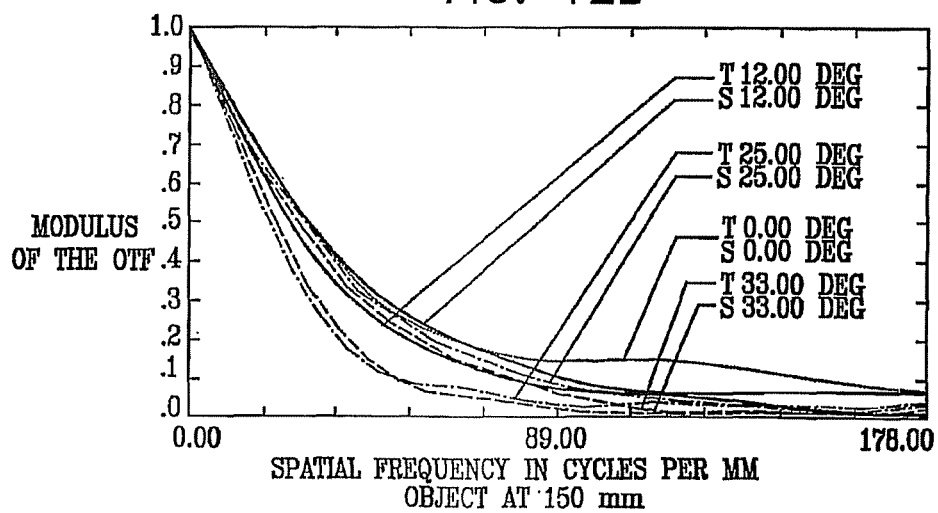
Figure 12G:
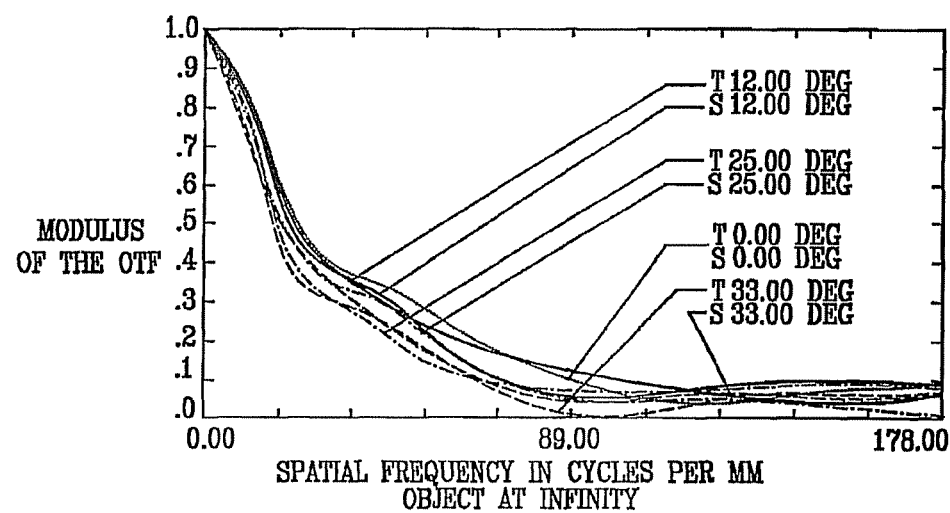

FIG. 12A is for an object 100 mm from camera 20; FIG. 12B is for an object 150 mm from the camera; FIG. 12C is for an object 200 mm from the camera; FIG. 12D is for an object 300 mm from the camera; FIG. 12E is for an object 500 mm from the camera; FIG. 12F is for an object 1000 mm from the camera; and FIG. 12G is for an object at infinity.

Each figure comprises four fields of view 0°, 12°, 25°, and 33°. The sagittal (S) and tangential (T) orientation curves are shown for each field of view.

Inspection of the MTF curves shows that all MTF values for spatial frequencies above approximately 50 cycles per mm are low, equaling approximately 0.35 or less. The low MTF values are a consequence of the distorted image on sensor 24. However, because the MTF values are all approximately equal, the corrections applied by engine 26 generate substantially the same improvement to all the images, so as to produce approximately equal and high MTFs for all the corrected images.

It will be understood that the above MTF properties are not just for assembly 152, but apply to a range of assemblies 22 generated according to the steps and procedures of FIGS. 4 and 10, generating a camera with a depth of field from approximately 10 cm to infinity.

Figure 13:
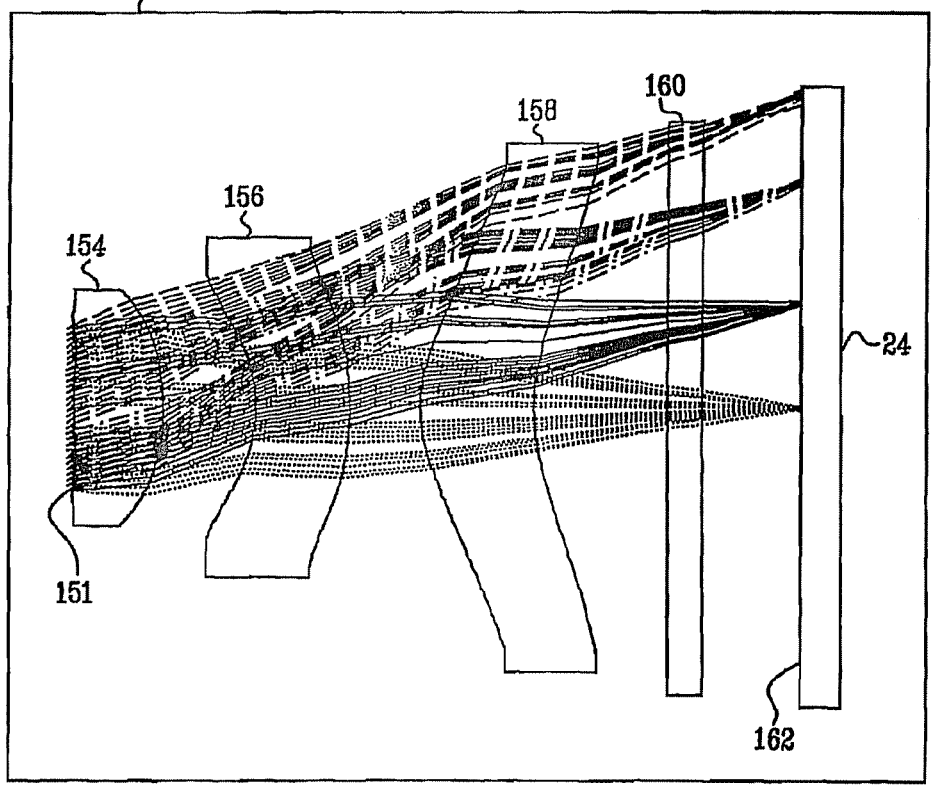
FIG. 13 is a schematic diagram of the exemplary optical imaging assembly, in accordance with an embodiment of the present invention.

FIG. 13 is a schematic diagram of optical imaging assembly 152, in accordance with an embodiment of the present invention. Assembly 152 comprises five components: an aperture 151, three lenses 154, 156, 158 and an infra-red filter 160. Assembly 152 forms its image on a front surface 162 of sensor 24, so that the front surface acts as a focal plane of the assembly. Each lens has two aspheric surfaces, each surface being defined by expression (6):

$$z = \frac{cr^2}{1 + \sqrt{1 - (1+k)c^2 r^2}} + \sum_{n=2}^{n=8} \alpha_n r^{2n} \tag{6}$$

where
z is a surface sag,
r is a radius measured to an optic axis,
o, k are curvature and conic constants for the surface, and
$\alpha_2, \ldots \alpha_8$ are parameters for the surface.

Tables VI, VII, and VIII below show dimensions in mm and parameters of each of the ten surfaces of the assembly. In the tables, the surfaces of each component are distinguished by a suffix A or B. Thus, aperture 151 has surfaces 151A and 151B. In Table VI, the thickness gives the distance, measured along the optic axis, to the next surface, and thus gives spacings between the components. Thus, aperture 151 has a thickness of $5.0 \cdot 10^{-2}$ mm, the distance from surface 151B to the following surface, 154A, is $1.1 \cdot 10^{-2}$, and the distance from the final surface of the assembly, surface 160B of filter 160, to the sensor, is $8.61 \cdot 10^{-1}$ mm.

TABLE VI

| Element and Surface | | Material | Curvature (c) | Thickness | Semi-diameter | Conic constant (k) |
|---|---|---|---|---|---|---|
| Aper- | A | — | — | 5.00E−02 | 7.50E−01 | — |
| ture 151 | B | | | 1.10E−02 | 7.50E−01 | — |
| Lens 154 | A | E48R | 9.57E−02 | 7.75E−01 | 8.50E−01 | 9.74E+01 |
| | B | | −4.46E−01 | 8.17E−01 | 1.05E+00 | 0.00E+00 |
| Lens 156 | A | OKP4 | −7.60E−01 | 8.44E−01 | 1.24E+00 | −3.37E+00 |
| | B | | −2.42E−01 | 6.31E−01 | 1.51E+00 | 2.38E+00 |
| Lens 158 | A | E48R | 8.10E−01 | 1.00E+00 | 2.24E+00 | −4.03E+00 |
| | B | | 5.17E−01 | 1.17E+00 | 2.35E+00 | −4.07E+00 |
| Filter 160 | A | BK7 | 0.00E+00 | 3.00E−01 | 2.55E+00 | 0.00E+00 |
| | B | | 0.00E+00 | 8.61E−01 | 2.55E+00 | 0.00E+00 |

TABLE VII

| | Aspheric Parameter | | | |
|---|---|---|---|---|
| Surface | $\alpha_2$ | $\alpha_3$ | $\alpha_4$ | $\alpha_5$ |
| 154A | −1.38E−02 | −9.00E−01 | 2.83E+00 | −2.26E+00 |
| 154B | −9.83E−02 | 1.24E−01 | −4.25E−01 | 7.62E−01 |
| 156A | −2.63E−01 | 3.81E−01 | −4.78E−01 | 6.04E−01 |
| 156B | −2.42E−01 | 3.23E−01 | −2.94E−01 | 1.93E−01 |
| 158A | −1.48E−02 | 1.01E−03 | 1.48E−03 | −5.69E−04 |
| 158B | −2.29E−02 | 5.83E−03 | −6.90E−04 | −9.33E−05 |

TABLE VIII

| | Aspheric Parameter | | |
|---|---|---|---|
| Surface | $\alpha_6$ | $\alpha_7$ | $\alpha_8$ |
| 154A | −2.96E+00 | 2.69E+00 | 1.61E+00 |
| 154B | −8.04E−01 | 4.73E−01 | −1.28E−01 |
| 156A | −4.52E−01 | 1.58E−01 | −1.74E−02 |
| 156B | −7.36E−02 | 1.39E−02 | −9.05E−04 |
| 158A | 6.66E−05 | 2.82E−06 | −9.13E−07 |
| 158B | 3.50E−05 | −2.76E−06 | −3.27E−08 |

Plastic E48R is produced by Zeon Corporation of Tokyo, Japan and has a refractive index approximately equal to 1.53. Material OKP4 is produced by Osaka Gas Chemicals Ltd., of Japan and has a refractive index approximately equal to 1.61. Glass BK7 is produced by Schott AG of Mainz, Germany and has a refractive index approximately equal to 1.52.

Table IX below gives Zernike fringe coefficient values for assembly 152.

TABLE IX

| | Zernike Fringe Coefficient Values. Angle subtended to optic axis. | | | |
|---|---|---|---|---|
| | 0.0° | 12.08° | 24.86° | 32.98° |
| Z1 | 1.00288770 | 1.02127383 | 0.96201500 | 0.85454775 |
| Z2 | 0.00000000 | 0.00000000 | 0.00000000 | 0.00000000 |
| Z3 | 0.00000000 | −0.05223421 | 0.05807529 | −0.30413404 |
| Z4 | 0.87386304 | 0.90256837 | 0.79178522 | 0.64302633 |
| Z5 | 0.00000000 | 0.26444145 | 0.26333002 | 0.39499181 |
| Z6 | 0.00000000 | 0.00000000 | 0.00000000 | 0.00000000 |
| Z7 | 0.00000000 | 0.00000000 | 0.00000000 | 0.00000000 |
| Z8 | 0.00000000 | −0.11110116 | −0.10841115 | −0.29131996 |
| Z9 | 0.01038369 | 0.02086120 | −0.03451554 | −0.13998095 |
| Z10 | 0.00000000 | 0.00000000 | 0.00000000 | 0.00000000 |
| Z11 | 0.00000000 | −0.02198021 | 0.04819563 | 0.12033762 |
| Z12 | 0.00000000 | −0.02888193 | −0.03276898 | −0.00332529 |
| Z13 | 0.00000000 | 0.00000000 | 0.00000000 | 0.00000000 |
| Z14 | 0.00000000 | 0.00000000 | 0.00000000 | 0.00000000 |
| Z15 | 0.00000000 | −0.08992847 | −0.28884894 | −0.49929953 |
| Z16 | −0.17964427 | −0.17714956 | −0.20757048 | −0.28003848 |
| Z17 | −0.00011960 | −0.01441891 | −0.00335795 | −0.04129877 |
| Z18 | 0.00000000 | 0.00000000 | 0.00000000 | 0.00000000 |
| Z19 | 0.00000000 | 0.00000000 | 0.00000000 | 0.00000000 |
| Z20 | 0.00000000 | −0.01596180 | 0.01304892 | 0.02364346 |
| Z21 | 0.00000000 | −0.03213805 | −0.01154570 | 0.05277862 |
| Z22 | 0.00000000 | 0.00000000 | 0.00000000 | 0.00000000 |
| Z23 | 0.00000000 | 0.00000000 | 0.00000000 | 0.00000000 |
| Z24 | 0.00000000 | −0.08180872 | −0.20527244 | −0.44185571 |
| Z25 | −0.48135930 | −0.46936616 | −0.47693323 | −0.52697618 |
| Z26 | 0.00000000 | 0.00000000 | 0.00000000 | 0.00000000 |
| Z27 | 0.00000000 | 0.01252334 | −0.01680502 | −0.06101027 |
| Z28 | −0.00008701 | 0.00361287 | 0.00625800 | −0.05449299 |
| Z29 | 0.00000000 | 0.00000000 | 0.00000000 | 0.00000000 |
| Z30 | 0.00000000 | 0.00000000 | 0.00000000 | 0.00000000 |
| Z31 | 0.00000000 | 0.00651342 | 0.00031433 | 0.02571492 |
| Z32 | 0.00000000 | −0.00278981 | −0.02750737 | −0.04436984 |
| Z33 | 0.00000000 | 0.00000000 | 0.00000000 | 0.00000000 |
| Z34 | 0.00000000 | 0.00000000 | 0.00000000 | 0.00000000 |
| Z35 | 0.00000000 | 0.05963151 | 0.13690960 | 0.06819783 |
| Z36 | 0.00488173 | 0.00883963 | 0.01251918 | −0.07682018 |
| Z37 | 0.19407879 | 0.18190738 | 0.14804313 | 0.08214757 |

Inspection of Table IX shows that for all fields of view the values of Z4 are between approximately 0.6 and approximately 0.9, and the values of Z16 are between approximately −0.2 and approximately −0.3. Furthermore, the values of Z1, Z4, Z9, Z16, Z25, Z36, and Z37 in Table IX are all close to the target values in Table III.

Although the embodiments described above refer to certain specific digital filters, and particularly to a deconvolution filter (DCF), the principles of the present invention may similarly be applied in electronic cameras that use other types of digital image filters, as are known in the art.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A method for forming an optical imaging assembly, comprising:
   providing an aperture for the optical imaging assembly configured to collect a portion of optical radiation from an object;
   providing an optical assembly configured to collect at least a subset of the portion of optical radiation, and comprising a set of at least three lenses, the optical assembly having substantially cylindrical symmetry with respect to a common optical axis;
   arranging the set of at least three lenses to facilitate forming an optical image from a subset of the collected portion of optical radiation at a focal plane of the optical imaging assembly, the optical image comprising:
a modulation transfer function for spatial frequencies greater than 50 cycles per millimeter having at least one value smaller than or equal to about 0.35.

2. The method of claim 1, wherein arranging the set of at least three lenses to facilitate forming the optical image, further comprises the optical image having a point spread function at least about 14 µm on the focal plane.

3. The method of claim 1, further comprising providing an infra-red filter and positioning the infra-red filter between the set of at least three lenses and the focal plane.

4. The method of claim 1, further comprising providing an image sensor substantially co-planar with the focal plane.

5. The method of claim 1, further comprising arranging the set of at least three lenses to facilitate forming the optical image with a defocus aberration coefficient greater than about 0.1.

6. The method of claim 5, further comprising providing a deconvolution engine for correcting at least a portion of image distortion of the optical image generated by the set of at least three lenses.

7. The method of claim 6, further comprising providing a virtual phase plate in conjunction with the set of at least three lenses, the virtual phase plate having characteristics to generate the defocus aberration coefficient, the characteristics being substantially negatives of corresponding characteristics of the deconvolution engine for correcting at least the portion of the image distortion.

8. The method of claim 6, further comprising arranging the set of at least three lenses to facilitate forming the optical image so that the modulation transfer function has a range of values for all objects from a far field to at least twenty centimeters from the optical assembly, the range of values between about 0.25 and about 0.40.

9. The method of claim 8, wherein providing the deconvolution engine further comprises configuring the deconvolution engine to improve the image distortion for all objects from the far field to at least twenty centimeters from the optical assembly.

10. A method for forming an optical imaging assembly, including:
providing a plurality of lenses having cylindrical symmetry and surfaces with curvatures and spacings between the surfaces; and
arranging the lenses so that an optical image formed by the plurality of lenses has a defocus aberration coefficient greater than 0.1 at a focal plane of the assembly.

11. The method of claim 10, further comprising arranging the lenses so that the optical image has a defocus aberration coefficient greater than about 0.6 and less than or equal to about 0.9 at the focal plane.

12. The method of claim 10, further comprising arranging the lenses so that the optical image has a fifth order spherical aberration between about −0.2 and about −0.3.

13. The method of claim 10, further comprising arranging the lenses so that the optical image has a seventh order spherical aberration that is about −0.5.

14. The method of claim 10, further comprising arranging the lenses so that the optical image has a ninth order spherical aberration that is about zero.

15. The method of claim 10, further comprising arranging the lenses so that the optical image subtends a field of view up to about thirty three degrees to an optical axis of the optical imaging assembly.

16. The method of claim 10, further comprising arranging the lenses so that the optical image is a focused image of an object at a distance equal to or greater than about ten centimeters from the optical imaging assembly.

17. The method of claim 10, further comprising arranging the lenses so that a modulation transfer function of the optical image is less than or equal to 0.35 for spatial frequencies greater than 50 cycles per millimeter.

18. The method of claim 10, further comprising arranging the lenses so that the optical image has an extent of a point spread function equal to or greater than about fourteen micrometers at the focal plane.

* * * * *